US012675375B2

(12) United States Patent
Sandhu et al.

(10) Patent No.: US 12,675,375 B2
(45) Date of Patent: Jul. 7, 2026

(54) APPARATUS AND METHODS FOR RECOVERING POWER ON READ FAILING DIE

(71) Applicant: Sandisk Technologies, Inc., Milpitas, CA (US)

(72) Inventors: Navkiran Sandhu, Dublin, CA (US); Rajan Paudel, Fremont, CA (US); Deepak Bharadwaj, Fremont, CA (US); Jiahui Yuan, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 0 days.

(21) Appl. No.: 18/961,816

(22) Filed: Nov. 27, 2024

(65) Prior Publication Data

US 2026/0147674 A1     May 28, 2026

(51) Int. Cl.
| | |
|---|---|
| *G06F 11/00* | (2006.01) |
| *G06F 11/14* | (2026.01) |
| *G06F 11/1446* | (2026.01) |
| *G06F 11/26* | (2006.01) |
| *G11C 29/00* | (2006.01) |

(52) U.S. Cl.
CPC ...... *G06F 11/1469* (2013.01); *G06F 11/1417* (2013.01); *G06F 11/26* (2013.01); *G11C 29/70* (2013.01)

(58) Field of Classification Search
None
See application file for complete search history.

(56) References Cited

U.S. PATENT DOCUMENTS

| | | | |
|---|---|---|---|
| 9,626,109 B2 | 4/2017 | Katsurayama et al. | |
| 10,990,378 B2 | 4/2021 | Park | |
| 11,934,254 B2 | 3/2024 | Chen et al. | |
| 2007/0233938 A1 | 10/2007 | Cho et al. | |
| 2007/0244941 A1 | 10/2007 | Reed et al. | |
| 2013/0166893 A1 | 6/2013 | Dusija et al. | |
| 2013/0339784 A1 | 12/2013 | Bickelman et al. | |
| 2014/0089563 A1* | 3/2014 | Wu ....................... | G06F 3/0647 |
| | | | 711/E12.008 |
| 2020/0089410 A1 | 3/2020 | Park et al. | |
| 2024/0006010 A1* | 1/2024 | Tian ................... | G11C 29/4401 |
| 2024/0053905 A1* | 2/2024 | Basu ................... | G11C 7/1006 |

OTHER PUBLICATIONS

International Search Report and Written Opinion for PCT Application No. PCT/US2025/027025 dated Aug. 21, 2025.

* cited by examiner

*Primary Examiner* — Bryce P Bonzo
*Assistant Examiner* — Gabriella Kanani Shelton
(74) *Attorney, Agent, or Firm* — PEARL COHEN ZEDEK LATZER BARATZ LLP

(57) ABSTRACT

An apparatus is provided that includes a first memory die including first corresponding initialization information and a first data latch, and a first control circuit coupled to the first memory die. The first control circuit is configured to send a power on read command to the first memory die, determine that the first memory die reported a power on read failure, retrieve a first backup copy of the first corresponding initialization information from a first storage location outside the first memory die, and load the retrieved first backup copy of the first corresponding initialization information to the first data latch.

20 Claims, 29 Drawing Sheets

600

900

902

For Each Memory Die,
Program ROMBLK with
Corresponding Memory Die
Initialization Information

904

For Each Memory Die,
Designate a Corresponding
External Initialization
information Backup Location

906

For Each Memory Die,
Save Backup Initialization
Information in Designated
Corresponding  External
Initialization information
Backup Location

| Mem Die $1010_1$ | BB $1020_2$ | BB $1020_2$ | BB $1020_2$ | BB $1020_3$ | BB $1020_3$ | BB $1020_3$ | BB $1020_4$ | BB $1020_4$ | BB $1020_4$ |
| Mem Die $1010_2$ | BB $1020_1$ | BB $1020_3$ | BB $1020_4$ | BB $1020_4$ | BB $1020_1$ | BB $1020_3$ | BB $1020_3$ | BB $1020_3$ | BB $1020_1$ |
| Mem Die $1010_3$ | BB $1020_4$ | BB $1020_4$ | BB $1020_1$ | BB $1020_2$ | BB $1020_4$ | BB $1020_1$ | BB $1020_2$ | BB $1020_2$ | BB $1020_2$ |
| Mem Die $1010_4$ | BB $1020_3$ | BB $1020_1$ | BB $1020_3$ | BB $1020_1$ | BB $1020_2$ | BB $1020_2$ | BB $1020_2$ | BB $1020_1$ | BB $1020_3$ |

APPARATUS AND METHODS FOR RECOVERING POWER ON READ FAILING DIE

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may be non-volatile memory or volatile memory. A non-volatile memory allows information to be stored and retained even when the non-volatile memory is not connected to a source of power (e.g., a battery).

Non-volatile memory devices include one or more memory chips having multiple arrays of memory cells. The memory arrays may have associated decoders and circuits for performing read, write, and erase operations. Memory cells within the arrays may be arranged in horizontal rows and vertical columns. Each row may be addressed by a word line, and each column may be addressed by a bit line. Data may be loaded into columns of the array using a series of data busses. Each column may hold a predefined unit of data, for instance, a word encompassing two bytes of information.

However, various challenges exist in fabricating such non-volatile memory devices.

BRIEF DESCRIPTION OF THE DRAWINGS

Like-numbered elements refer to common components in the different figures.

FIG. 9B is a diagram depicting various scenarios for external initialization information backup locations for a memory system that includes four memory die.

FIG. 11B depicts memory system 1100 of FIG. 11A during an in-field power on read sequence.

DETAILED DESCRIPTION

Technology is described for recovering a memory die that fails to initialize in response to a power on read command. In an embodiment, initialization parameters for a memory die are stored on the memory die, and a backup copy of the initialization parameters is also stored in a storage location outside the first memory die. In embodiments, the storage location outside the first memory die may be a second memory die, a memory controller coupled to the first memory die, or some other location outside the first memory die.

In embodiments, if the memory die fails to initialize in response to a power on read command, the backup copy of the initialization parameters is retrieved from the storage location, and loaded into a data register on the memory die to attempt to initialize the memory die. In embodiments, a test memory operation (e.g., a read operation) is performed on the memory die to determine if the memory die successfully initialized.

Figure 1:
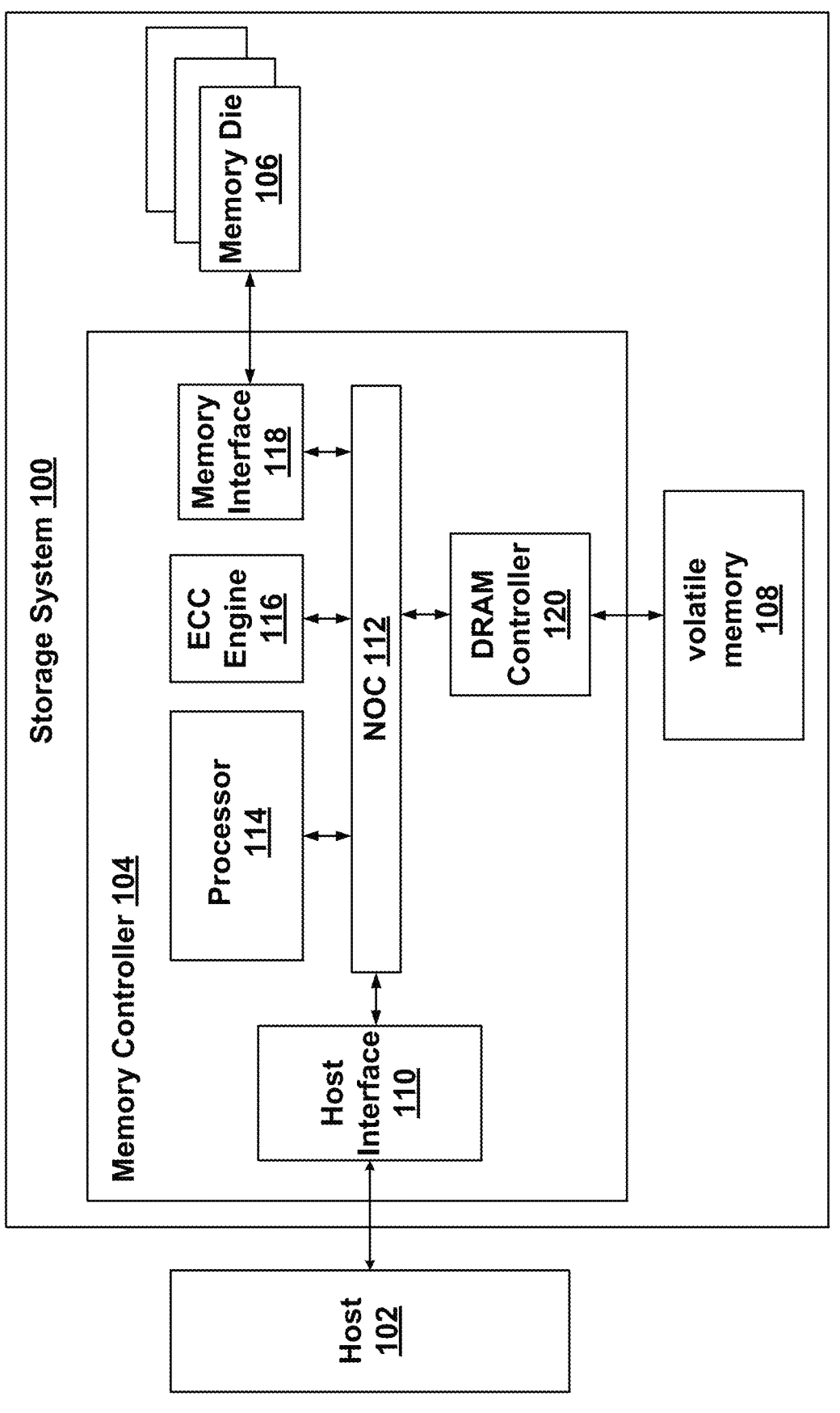
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 also can be a memory card, USB drive or other type of storage system. The proposed technology is not limited to any one type of memory system.

Storage system 100 is connected to a host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 104 connected to memory die 106 and local high speed volatile memory 108 (e.g., DRAM). Local high speed volatile memory 108 is used by memory controller 104 to perform certain functions. For example, local high speed volatile memory 108 stores logical to physical address translation tables ("L2P tables").

Memory controller 104 includes a host interface 110 that is connected to and in communication with host 102. In one embodiment, host interface 110 implements a NVM Express (NVMe) over PCI Express (PCIe). Other interfaces can also be used, such as SCSI, SATA, etc. Host interface 110 also is connected to a network-on-chip (NOC) 112.

A NOC is a communication subsystem on an integrated circuit. NOCs can span synchronous and asynchronous clock domains or use un-clocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs.

The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 112 can be replaced by a bus.

Connected to and in communication with NOC 112 is a processor 114, an ECC engine 116, a memory interface 118, and a DRAM controller 120. DRAM controller 120 is used to operate and communicate with local high speed volatile memory 108 (e.g., DRAM). In other embodiments, local high speed volatile memory 108 can be SRAM or another type of volatile memory.

Processor 114 performs the various controller memory operations, such as programming, erasing, reading, and memory management processes. In one embodiment, processor 114 is programmed by firmware. In other embodiments, processor 114 is a custom and dedicated hardware circuit without any software. Processor 114 also implements a translation module, as a software/firmware process or as a dedicated hardware circuit.

In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 104 (e.g., the translation module) performs address translation between the logical addresses used by the host and the physical addresses used by the memory die.

One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables.

Instead, the logical address to physical address tables (or L2P tables) can be any type of data structure. In some examples, the memory space of a storage system is so large that the local memory 108 cannot hold all of the L2P tables. In such a case, the entire set of L2P tables are stored in memory die 106 and a subset of the L2P tables are cached (L2P cache) in the local high speed volatile memory 108.

ECC engine 116 performs error correction services. For example, ECC engine 116 performs data encoding and decoding, as per the implemented ECC technique. In one embodiment, ECC engine 116 is an electrical circuit programmed by software. For example, ECC engine 116 can be a processor that can be programmed. In other embodiments, ECC engine 116 is a custom and dedicated hardware circuit without any software. In another embodiment, the function of ECC engine 116 is implemented by processor 114.

Memory interface 118 communicates with memory die 106. In one embodiment, memory interface 118 provides a Toggle Mode interface. In another embodiment, memory interface 118 provides a double data rate (DDR) interface. Other interfaces also can be used. In some example implementations, memory interface 118 (or another portion of controller 104) implements a scheduler and buffer for transmitting data to and receiving data from one or more memory die.

Figure 2A:
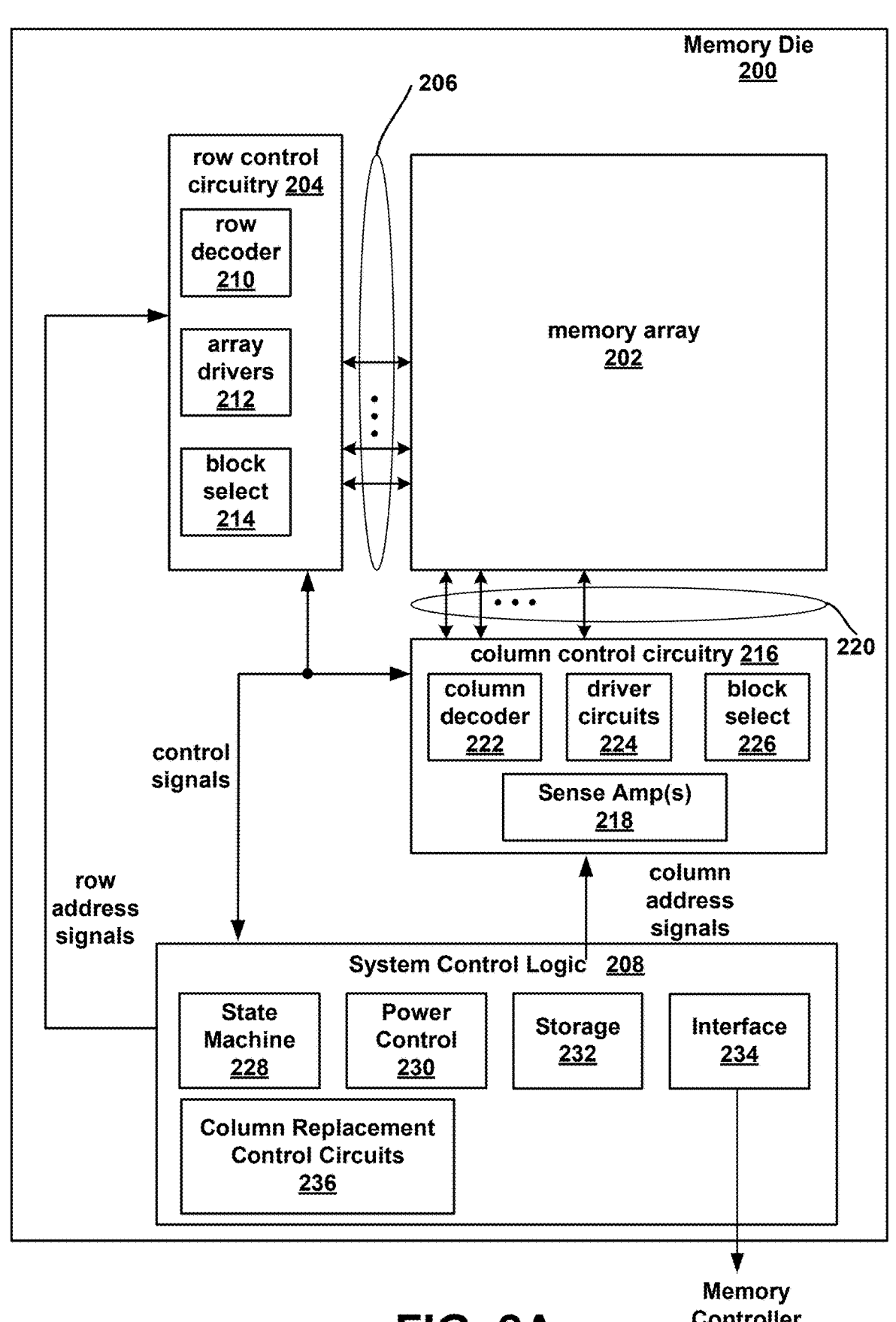
FIG. 2A is a block diagram of one embodiment of a memory die.

In one embodiment, storage system 100 includes one or more memory die 106. FIG. 2A is a functional block diagram of one embodiment of memory die 106 of FIG. 1. Each of memory die 106 can be implemented as memory die 200 of FIG. 2A. The components depicted in FIG. 2A are electrical circuits.

Memory die 200 includes a memory array 202 that can include non-volatile memory cells, as described in more detail below. The array terminal lines of memory array 202 include the various layer(s) of word lines organized as rows, and the various layer(s) of bit lines organized as columns. However, other orientations can also be implemented.

Memory die 200 includes row control circuitry 204, whose outputs 206 are connected to respective word lines of the memory array 202. Row control circuitry 204 receives a group of M row address signals and one or more various control signals from system control logic circuit 208, and typically may include such circuits as row decoders 210, array terminal drivers 212, and block select circuitry 214 for both reading and writing (programming) operations.

Row control circuitry 204 also may include read/write circuitry. Memory die 200 also includes column control circuitry 216 including sense amplifier(s) 218 whose input/outputs 220 are connected to respective bit lines of memory array 202. Although only a single block is shown for memory array 202, a memory die 200 can include multiple arrays that can be individually accessed.

Column control circuitry 216 receives a group of N column address signals and one or more various control signals from system control logic 208, and typically may include such circuits as column decoders 222, array terminal receivers or driver circuits 224, block select circuitry 226, as well as read/write circuitry, and I/O multiplexers.

System control logic 208 receives data and commands from memory controller 104 (FIG. 1) and provides output data and status to host 102. In some embodiments, system control logic 208 (which includes one or more electrical circuits) includes a state machine 228 that provides die-level control of memory operations.

In one embodiment, state machine 228 is programmable by software. In other embodiments, state machine 228 does not use software and is completely implemented in hardware (e.g., electrical circuits). In another embodiment, state machine 228 is replaced by a micro-controller or micropro-cessor, either on or off the memory chip.

System control logic 208 also can include a power control module 230 that controls the power and voltages supplied to the rows and columns of memory array 202 during memory operations and may include charge pumps and regulator circuit for creating regulating voltages. In embodiments, power control module 230 includes circuits and provides control signals that are used to selectively couple to a power supply (e.g., GROUND) various buses that are coupled to source lines for the entire memory array 202. As described in more detail below, such control signals are distributed on control signal lines that extend across the entire memory die 200. System control logic 208 includes storage 232 (e.g., RAM, registers, latches, etc.), which may be used to store parameters for operating memory array 202.

Commands and data are transferred between memory controller 104 and memory die 200 via memory controller interface 234 (also referred to as a "communication inter-face"). Memory controller interface 234 is an electrical interface for communicating with memory controller 104. Examples of memory controller interface 234 include a Toggle Mode Interface, a DDR interface, an Open NAND Flash Interface (ONFI), or other similar high speed inter-face. Other I/O interfaces can also be used. In a DDR clock scheme, rising edges and falling edges of a clock signal are sampling transitions.

In an embodiment, system control logic 208 also includes column replacement control circuits 236, described in more detail below.

In some embodiments, all elements of memory die 200, including the system control logic 208, can be formed as part of a single die. In other embodiments, some or all of the system control logic 208 can be formed on a different die.

In one embodiment, memory array 202 includes a three-dimensional memory array of non-volatile memory cells in which multiple memory levels are formed above a single substrate, such as a wafer. Memory array 202 may include any type of non-volatile memory that are monolithically formed in one or more physical levels of memory cells having an active area disposed above a silicon (or other type of) substrate. In one example, the non-volatile memory cells comprise vertical NAND strings with charge-trapping lay-ers.

In another embodiment, memory array 202 includes a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory array 202 is not limited to the examples above. Many different types of memory array architectures or memory technologies can be used to form memory array 202. No particular non-volatile memory tech-nology is required for purposes of the new claimed embodi-ments proposed herein.

Other examples of suitable technologies for memory cells of memory array 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of memory array 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a pro-grammable metallization cell.

A conductive bridge memory element may be used as a state change element based on the physical relocation of ions within a solid electrolyte. In some cases, a conductive bridge memory element may include two solid metal electrodes, one relatively inert (e.g., tungsten) and the other electro-chemically active (e.g., silver or copper), with a thin film of the solid electrolyte between the two electrodes. As tem-perature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's mag-netization can be changed to match that of an external field to store memory. A memory device is built from a grid of such memory cells.

In one embodiment for programming, each memory cell lies between a pair of write lines arranged at right angles to each other, parallel to the cell, one above and one below the cell. When current is passed through them, an induced magnetic field is created. MRAM based memory embodi-ments will be discussed in more detail below.

Phase change memory (PCM) exploits the unique behav-ior of chalcogenide glass. One embodiment uses a GeTe—$Sb_2Te_3$ super lattice to achieve non-thermal phase changes by simply changing the co-ordination state of the Germa-nium atoms with a laser pulse (or light pulse from another source). Therefore, the doses of programming are laser pulses. The memory cells can be inhibited by blocking the memory cells from receiving the light.

In other PCM embodiments, the memory cells are pro-grammed by current pulses. Note that the use of "pulse" in this document does not require a square pulse but includes a (continuous or non-continuous) vibration or burst of sound, current, voltage light, or another wave. These memory elements within the individual selectable memory cells, or bits, may include a further series element that is a selector, such as an ovonic threshold switch or metal insu-lator substrate.

A person of ordinary skill in the art will recognize that the technology described herein is not limited to a single spe-cific memory array, memory construction or material com-position, but covers many relevant memory arrays within the spirit and scope of the technology as described herein and as understood by one of ordinary skill in the art.

The elements of FIG. 2A can be grouped into two parts: (1) memory array 202 and (2) peripheral circuitry, which includes all of the other components depicted in FIG. 2A. An important characteristic of a memory circuit is its capacity, which can be increased by increasing the area of the memory die of storage system 100 that is given over to memory array 202. However, this reduces the area of the memory die available for the peripheral circuitry. This can place quite severe restrictions on these elements of the peripheral circuitry.

For example, the need to fit sense amplifier circuits within the available area can be a significant restriction on sense amplifier design architectures. With respect to system control logic 208, reduced availability of area can limit the available functions that can be implemented on-chip. Consequently, a basic trade-off in the design of a memory die for the storage system 100 is the amount of area to devote to memory array 202 and the amount of area to devote to the peripheral circuitry.

Another area in which memory array 202 and the peripheral circuitry are often at odds is in the processing involved in forming these regions, since these regions often involve differing processing technologies and the trade-off in having differing technologies on a single die. For example, when the memory array 202 is NAND flash, this is an NMOS structure, while the peripheral circuitry is often CMOS based.

For example, elements such sense amplifier circuits, charge pumps, logic elements in a state machine, and other peripheral circuitry in system control logic 208 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed die that are then bonded together. More specifically, memory array 202 can be formed on one die (referred to as the memory die) and some or all of the peripheral circuitry elements, including one or more control circuits, can be formed on a separate die (referred to as the control die).

For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology.

For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array.

The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
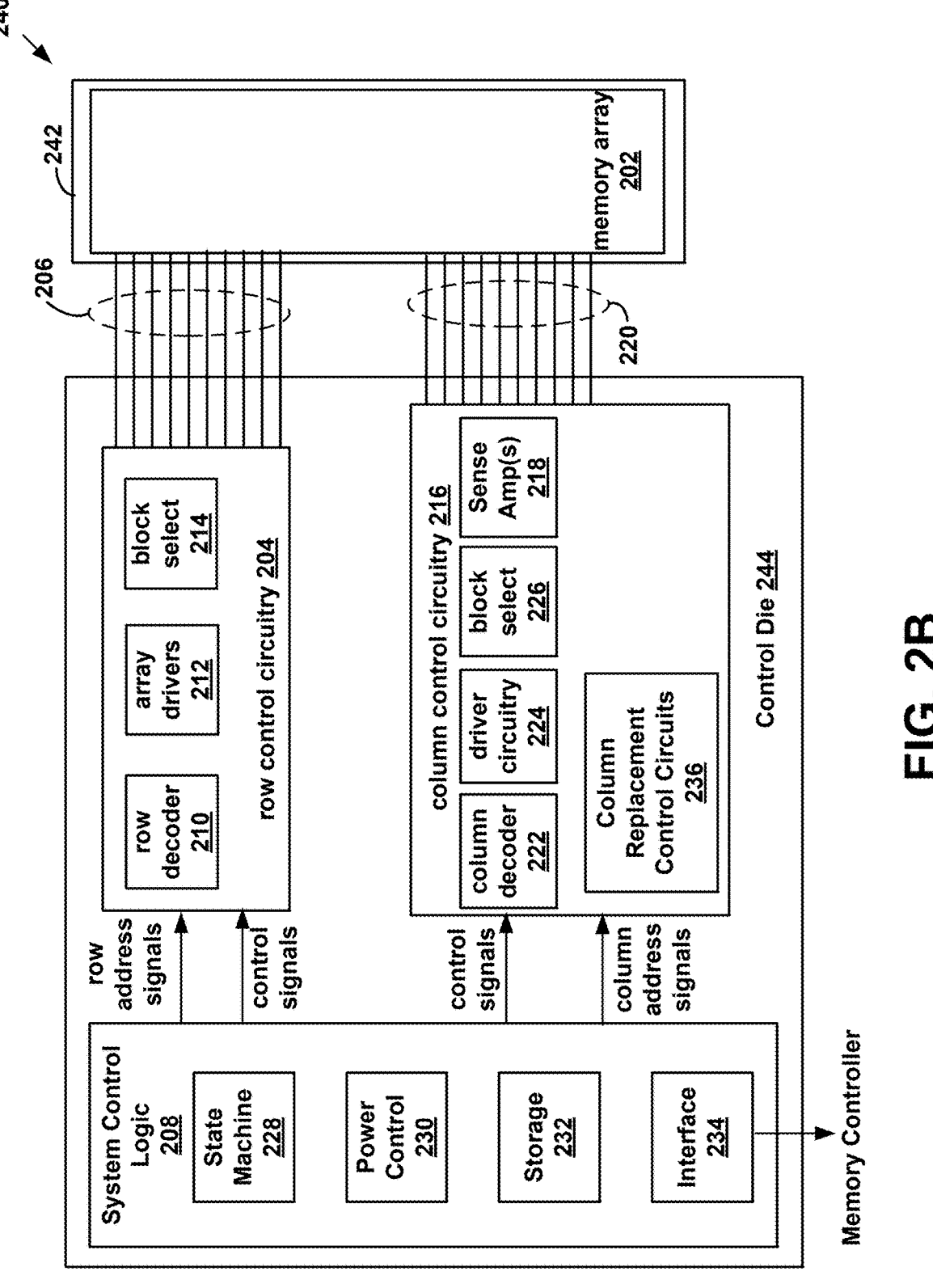
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 240. One or more integrated memory assemblies 240 may be used to implement memory die 106 of storage system 100.

Integrated memory assembly 240 includes two types of semiconductor die (or more succinctly, "die"). Memory die 242 includes memory array 202. Memory array 202 includes non-volatile memory cells. Control die 244 includes control circuitry 208, 216, and 204 (as described above). In some embodiments, control die 244 is configured to connect to memory array 202 in memory die 242. In some embodiments, memory die 242 and control die 244 are bonded together.

FIG. 2B shows an example of the peripheral circuitry, including control circuits, formed in a peripheral circuit or control die 244 coupled to memory array 202 formed in memory die 242. Common components are labelled similarly to FIG. 2A. System control logic 208, row control circuitry 204, and column control circuitry 216 are located in control die 244. In some embodiments, all or a portion of column control circuitry 216 and all or a portion of row control circuitry 204 are located on memory die 242. In some embodiments, some of the circuitry in system control logic 208 is located on memory die 242.

System control logic 208, row control circuitry 204, and column control circuitry 216 may be formed by a common process (e.g., CMOS process), so that adding elements and functions, such as ECC, more typically found on a memory controller 104 may require few or no additional process steps (i.e., the same process steps used to fabricate controller 104 may also be used to fabricate system control logic 208, row control circuitry 204, and column control circuitry 216).

Thus, while moving such circuits from a die such as memory 242 may reduce the number of steps needed to fabricate such a die, adding such circuits to a die such as control die 244 may not require many additional process steps. Control die 244 also could be referred to as a CMOS die, due to the use of CMOS technology to implement some or all of control circuitry 204, 208, 216.

FIG. 2B shows column control circuitry 216 including sense amplifier(s) 218 on control die 244 coupled to memory array 202 on memory die 242 through electrical paths 220. For example, electrical paths 220 may provide electrical connection between column decoder 222, driver circuitry 224, and block select 226 and bit lines of memory array 202. In an embodiment, column control circuitry 216 also includes column replacement control circuits 236, described in more detail below.

Electrical paths may extend from column control circuitry 216 in control die 244 through pads on control die 244 that are bonded to corresponding pads of the memory die 242, which are connected to bit lines of memory array 202. Each bit line of memory array 202 may have a corresponding electrical path in electrical paths 220, including a pair of bond pads, which connects to column control circuitry 216.

Similarly, row control circuitry 204, including row decoder 210, array drivers 212, and block select 214 are coupled to memory array 202 through electrical paths 206. Each of electrical path 206 may correspond to a word line, dummy word line, or select gate line. Additional electrical paths may also be provided between control die 244 and memory die 242.

For purposes of this document, the phrases "a control circuit" or "one or more control circuits" can include any one of or any combination of memory controller 104, state machine 228, all or a portion of system control logic 208, all or a portion of row control circuitry 204, all or a portion of column control circuitry 216, a microcontroller, a microprocessor, and/or other similar functioned circuits.

The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

In some embodiments, there is more than one control die 244 and more than one memory die 242 in an integrated memory assembly 240. In some embodiments, the integrated memory assembly 240 includes a stack of multiple control dies 244 and multiple memory dies 242.

Figure 3A:
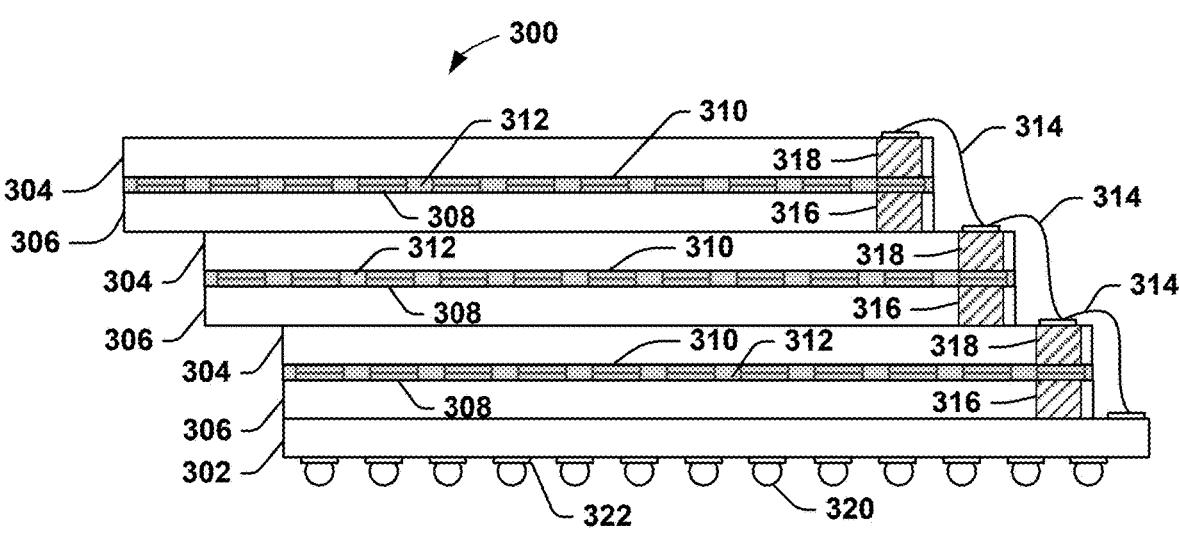
FIGS. 3A and 3B depict different embodiments of integrated memory assemblies.

FIG. 3A depicts a side view of an embodiment of an integrated memory assembly 300 stacked on a substrate 302 (e.g., a stack including control die 304 and memory die 306). The integrated memory assembly 300 has three control dies 304 and three memory die 306. In some embodiments, there are more than three memory dies 306 and more than three control dies 304.

Each control die 304 is affixed (e.g., bonded) to at least one memory die 306. Some of the bond pads 308/310 are depicted, although there may be many more bond pads. A space between two die 306, 304 that are bonded together is filled with a solid layer 312, which may be formed from epoxy or other resin or polymer. This solid layer 312 protects the electrical connections between the die 306, 304, and further secures the die together. Various materials may be used as solid layer 312, but in embodiments, it may be Hysol epoxy resin from Henkel Corp., having offices in California, USA.

Integrated memory assembly 300 may for example be stacked with a stepped offset, leaving the bond pads at each level uncovered and accessible from above. Wire bonds 314 connected to the bond pads connect control die 304 to substrate 302. A number of such wire bonds may be formed across the width of each control die 304 (i.e., into the page of FIG. 3A).

A memory die through silicon via (TSV) 316 may be used to route signals through each memory die 306. A control die TSV 318 may be used to route signals through each control die 304. The TSVs 316, 318 may be formed before, during or after formation of the integrated circuits in semiconductor die 306, 304. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 320 optionally may be affixed to contact pads 322 on a lower surface of substrate 302. Solder balls 320 may be used to couple integrated memory assembly 300 electrically and mechanically to a host device such as a printed circuit board. Solder balls 320 may be omitted where the integrated memory assembly 300 is to be used as an LGA package. Solder balls 320 may form a part of an interface between integrated memory assembly 300 and memory controller 104 (FIG. 1).

Figure 3B:
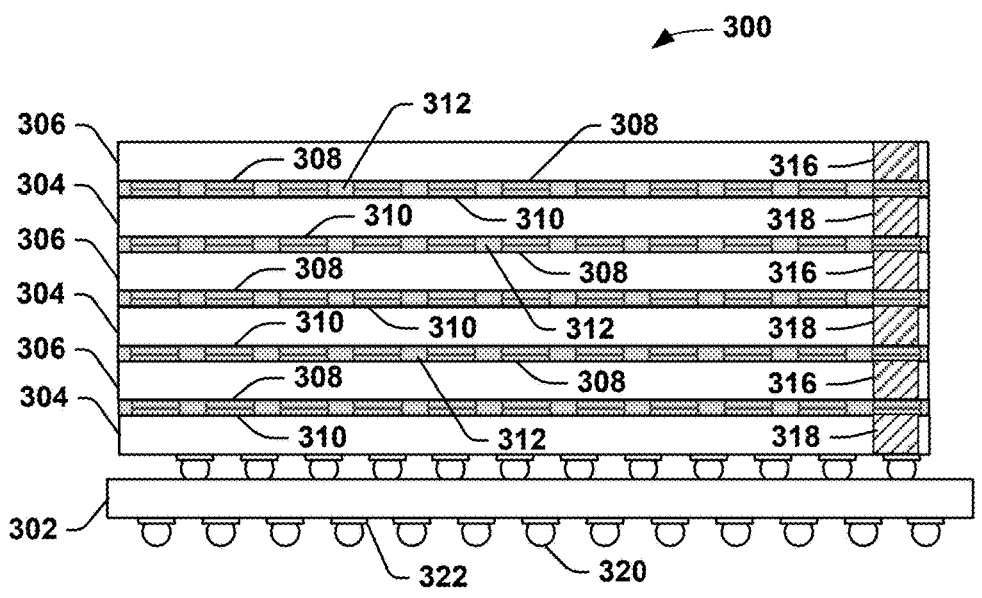

FIG. 3B depicts a side view of another embodiment of an integrated memory assembly 300 stacked on a substrate 302. The integrated memory assembly 300 of FIG. 3B has three control dies 304 and three memory dies 306. In some embodiments, there are many more than three memory dies 306 and many more than three control dies 304. In this example, each control die 304 is bonded to at least one memory die 306. Optionally, a control die 304 may be bonded to two or more memory dies 306.

Some of the bond pads 308, 310 are depicted. There may be many more bond pads. A space between two die 306, 304 that are bonded together is filled with a solid layer 312, which may be formed from epoxy or other resin or polymer. In contrast to the example in FIG. 3A, integrated memory assembly 300 of FIG. 3B does not have a stepped offset. A memory die TSV 316 may be used to route signals through each memory die 306. A control die TSV 318 may be used to route signals through each control die 304.

As has been briefly discussed above, control die 304 and memory die 306 may be bonded together. Bond pads on each control die 304 and each memory die 306 may be used to bond the two die together. In some embodiments, the bond pads are bonded directly to each other, without solder or other added material, in a so-called Cu-to-Cu bonding process.

In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension.

Such bonds may be formed at room temperature, though heat also may be applied. In embodiments using cu-to-cu bonding, the bond pads may be about 5 μm square and spaced from each other with a pitch of 5 μm to 5 μm. Although this process is referred to herein as cu-to-cu bonding, this term also may apply even where the bond pads are formed of materials other than copper.

When the area of bond pads is small, it may be difficult to bond the semiconductor die together. The size of and pitch between bond pads may be further reduced by providing a film layer on the surfaces of the semiconductor die including the bond pads. The film layer is provided around the bond pads. When the die are brought together, the bond pads may bond to each other, and the film layers on the respective die may bond to each other.

Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller (or greater) sizes and pitches.

Some embodiments may include a film on the surface of control die 304 and memory die 306. Where no such film is initially provided, a space between the die may be under filled with an epoxy or other resin or polymer. The under-fill material may be applied as a liquid which then hardens into a solid layer. This under-fill step protects the electrical connections between control die 304 and memory die 306, and further secures the die together. Various materials may be used as under-fill material, such as Hysol epoxy resin from Henkel Corp., having offices in California, USA.

Figure 4A:
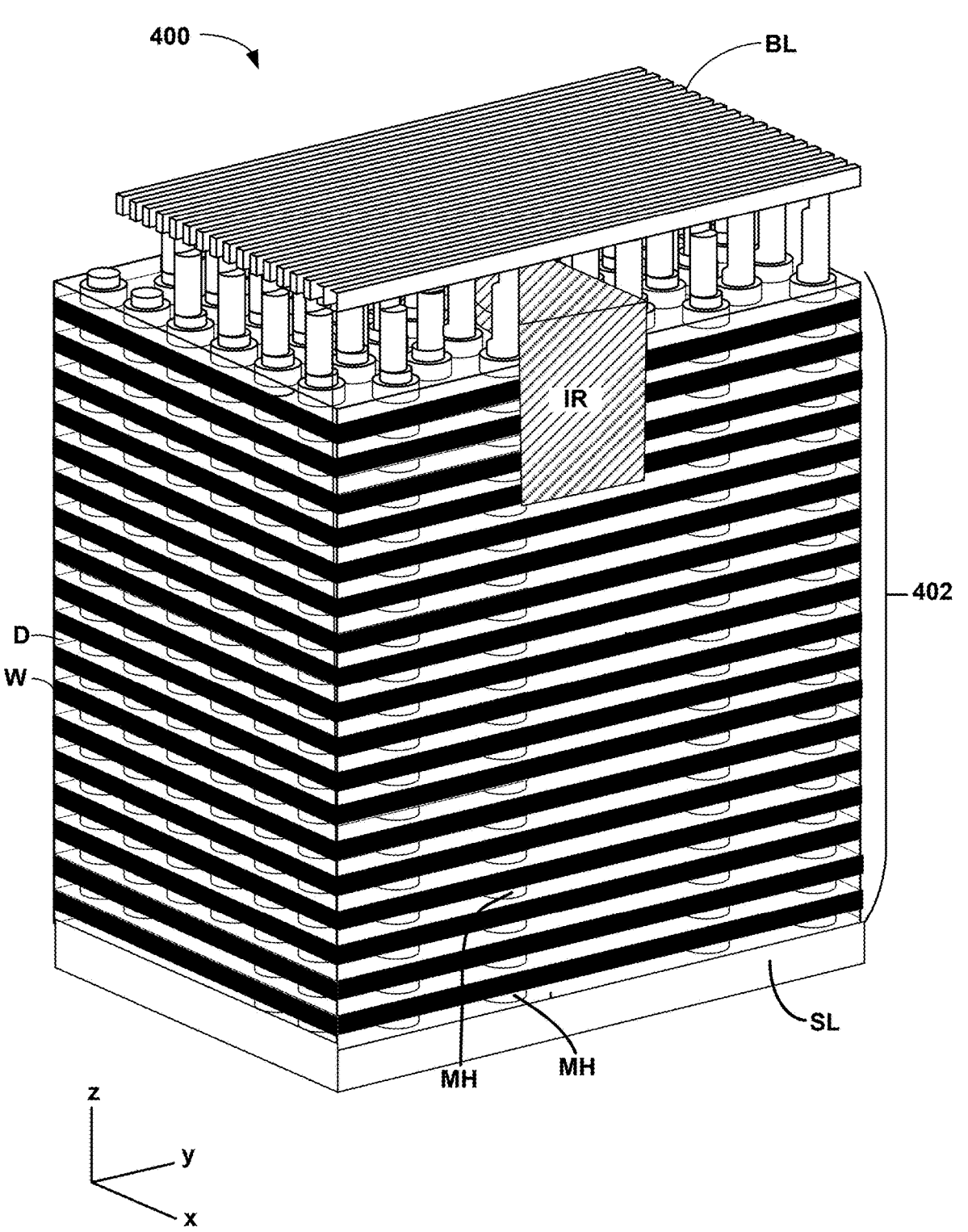
FIG. 4A is a perspective view of a portion of one embodiment of a monolithic three dimensional memory array.

FIG. 4A is a perspective view of a portion of one example embodiment of a monolithic three dimensional memory array/structure included in memory array 202, which includes a plurality non-volatile memory cells arranged as vertical NAND strings. For example, FIG. 4A shows a portion 400 of one block of memory.

The structure depicted includes a set of bit lines BL positioned above a stack 402 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements.

As will be explained below, in one embodiment the alternating dielectric layers and conductive layers are divided into four or five (or a different number of) regions by isolation regions IR. FIG. 4A shows one isolation region IR separating two regions. Below the alternating dielectric layers and word line layers is a source line layer SL. Memory holes are formed in the stack of alternating dielectric layers and conductive layers.

For example, one of the memory holes is marked as MH. Note that in FIG. 4A, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells.

Each memory cell can store one or more bits of data. Thus, the non-volatile memory cells are arranged in memory holes. More details of the three dimensional monolithic memory array that includes memory array 202 are provided below.

Figure 4B:
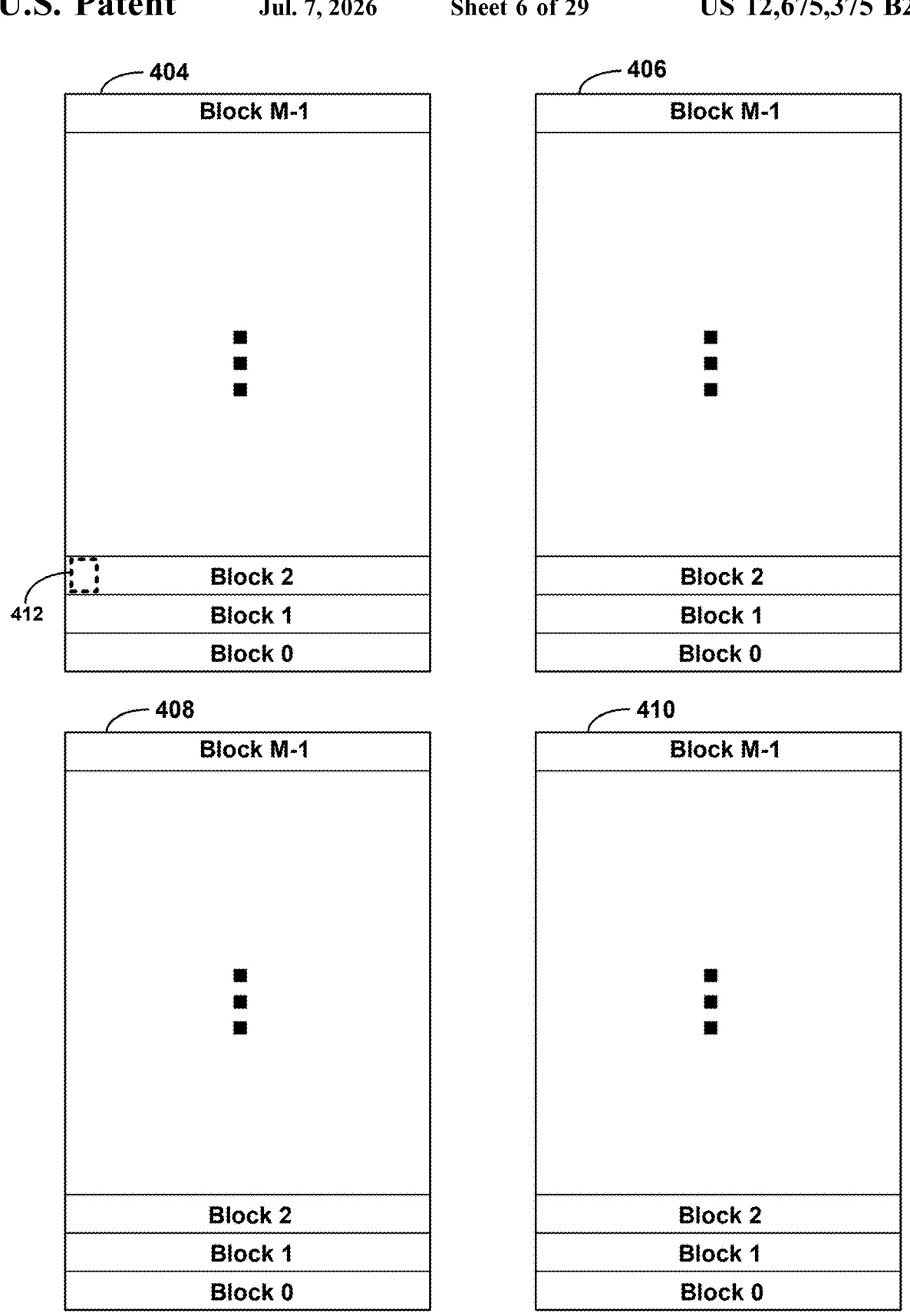
FIG. 4B is a block diagram of one embodiment of a memory array having four planes.

FIG. 4B is a block diagram explaining one example organization of memory array 202, which is divided into four planes 404, 406, 408 and 410. Each plane is then divided into M blocks. In one example, each plane has about 2000 blocks. However, different numbers of blocks and planes can also be used.

In one embodiment, a block of memory cells is a unit of erase. That is, all memory cells of a block are erased together. In other embodiments, blocks can be divided into sub-blocks and the sub-blocks can be the unit of erase. Memory also cells can be grouped into blocks for other reasons, such as to organize the memory array to enable the signaling and selection circuits.

In some embodiments, a block represents a groups of connected memory cells as the memory cells of a block share a common set of word lines. For example, the word lines for a block are all connected to all of the vertical NAND strings for that block. Although FIG. 4B shows four planes, more or less than four planes can be implemented. In some embodiments, memory array 202 includes eight planes.

Each block typically is divided into one or more pages. In an embodiment, a page is a unit of programming/writing and a unit of reading. Other units of programming also can be used. In an embodiment, one or more pages of data are typically stored in one row of memory cells. For example, one or more pages of data may be stored in memory cells connected to a common word line. In an embodiment, a page includes data stored in all memory cells connected to a common word line.

Figure 4C:
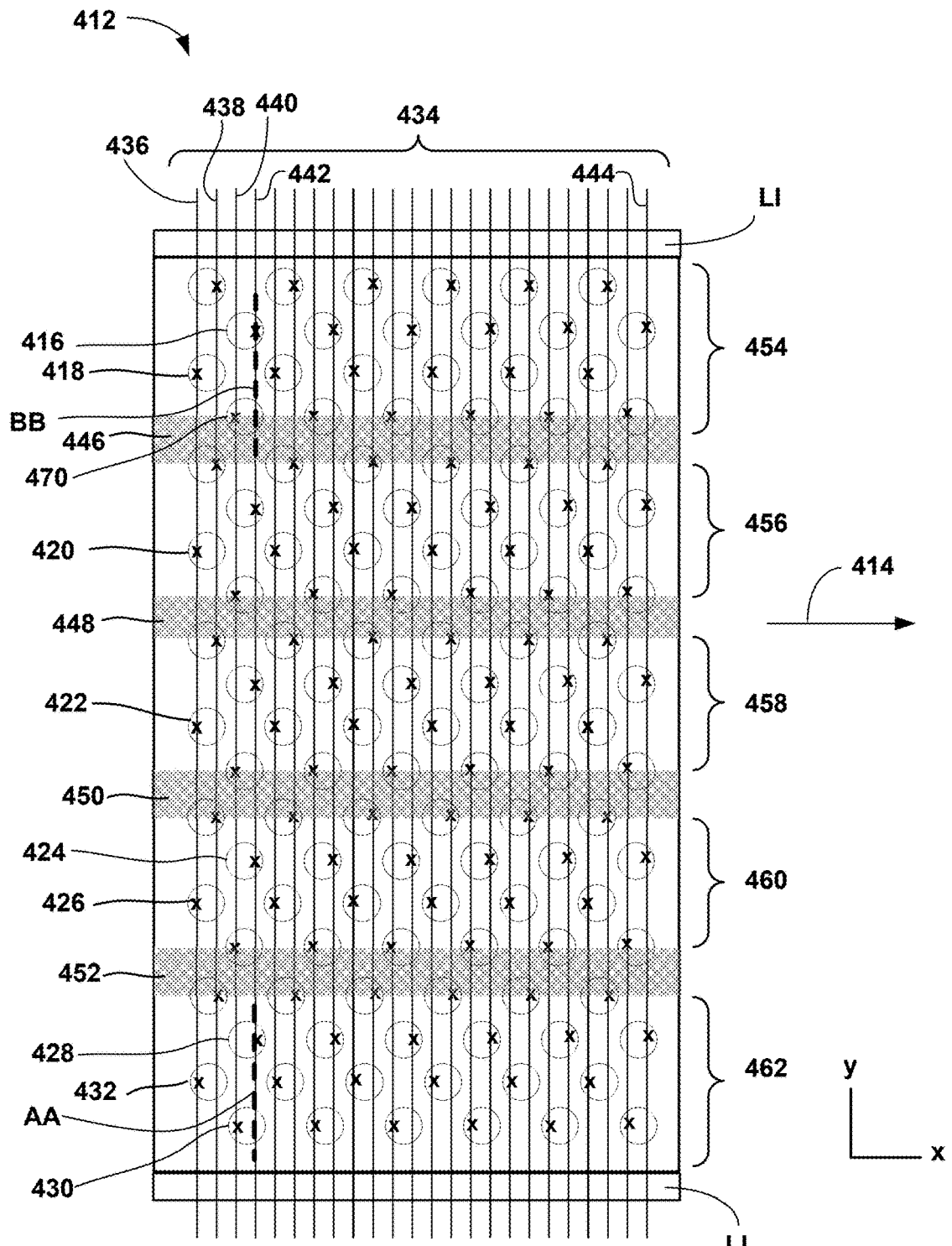
FIG. 4C depicts a top view of a portion of one embodiment of a block of memory cells.

FIGS. 4C-4G depict an example three dimensional ("3D") NAND structure that corresponds to the structure of FIG. 4A and can be used to implement memory array 202 of FIGS. 2A and 2B. FIG. 4C is a block diagram depicting a top view of a portion 412 of Block 2 of plane 404. As can be seen from FIG. 4C, the block depicted in FIG. 4C extends in the direction of 414. In one embodiment, the memory array has many layers. However, FIG. 4C only shows the top layer.

FIG. 4C depicts a plurality of circles that represent the memory holes, which are also referred to as vertical columns. Each of the memory holes/vertical columns include multiple select transistors (also referred to as a select gate or selection gate) and multiple memory cells. In one embodiment, each memory hole/vertical column implements a NAND string. For example, FIG. 4C labels a subset of the memory holes/vertical columns/NAND strings 416, 418, 420, 422, 424, 426, 428, 430 and 432.

FIG. 4C also depicts a set of bit lines 434, including bit lines 436, 438, 440, 442, . . . 444. FIG. 4C shows twenty four bit lines because only a portion of the block is depicted. It is contemplated that more than twenty four bit lines connected to memory holes/vertical columns of the block. Each of the circles representing memory holes/vertical columns has an "x" to indicate its connection to one bit line. For example, bit line 436 is connected to memory holes/vertical columns 418, 420, 422, 426 and 432.

The block depicted in FIG. 4C includes a set of isolation regions 446, 448, 450 and 452, which are formed of $SiO_2$. However, other dielectric materials also can be used. Isolation regions 446, 448, 450 and 452 serve to divide the top layers of the block into five regions. For example, the top layer depicted in FIG. 4C is divided into regions 454, 456, 458, 460 and 462.

In an embodiment, the isolation regions only divide the layers used to implement select gates so that NAND strings in different regions can be independently selected. In one example implementation, a bit line connects to one memory hole/vertical column/NAND string in each of regions 454, 456, 458, 460 and 462. In that implementation, each block has twenty four rows of active columns and each bit line connects to five rows in each block.

In an embodiment, all of the five memory holes/vertical columns/NAND strings connected to a common bit line are connected to the same set of word lines. In an embodiment, the system uses the drain side selection lines to choose one (or another subset) of the five to be subjected to a memory operation (program, verify, read, and/or erase).

FIG. 4C also shows Line Interconnects LI, which are metal connections to the source line SL from above the memory array. Line Interconnects LI are positioned adjacent regions 454 and 462.

Although FIG. 4C shows each region 454, 456, 458, 460 and 462 having four rows of memory holes/vertical columns, five regions and twenty four rows of memory holes/vertical columns in a block, those exact numbers are an example implementation. Other embodiments may include more or less regions per block, more or less rows of memory holes/vertical columns per region and more or less rows of vertical columns per block.

FIG. 4C also shows the memory holes/vertical columns being staggered. In other embodiments, different patterns of staggering can be used. In some embodiments, the memory holes/vertical columns are not staggered.

Figure 4D:
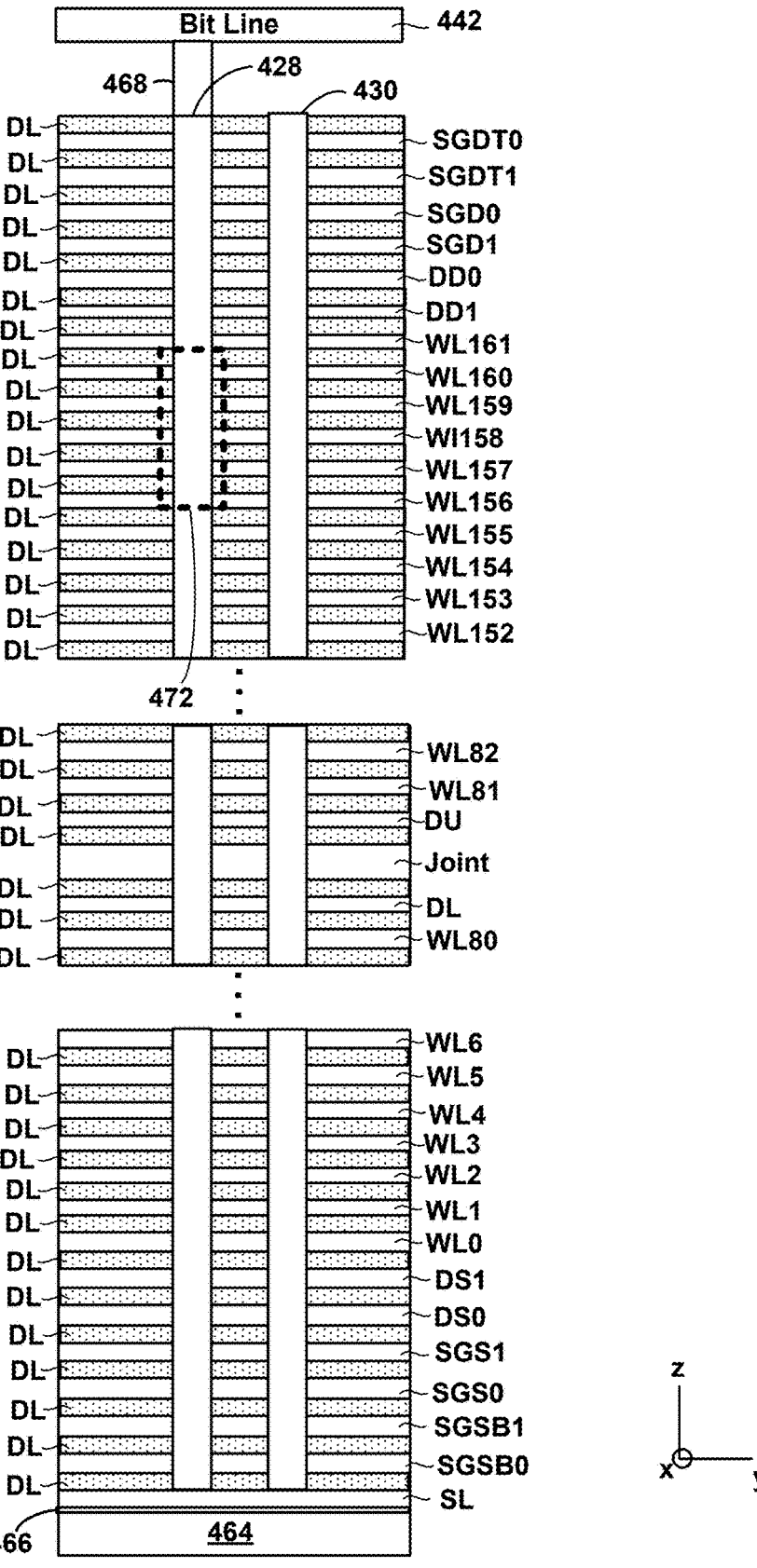
FIG. 4D depicts a cross sectional view of a portion of one embodiment of a block of memory cells.

FIG. 4D depicts a portion of one embodiment of a three dimensional memory array 202 showing a cross-sectional view along line AA of FIG. 4C. This cross sectional view cuts through memory holes/vertical columns (NAND strings) 428 and 430 of region 462 (see FIG. 4C).

The structure of FIG. 4D includes two drain side select layers SGD0 and SGD1, two source side select layers SGS0 and SGS1, two drain side transistor layers SGDT0 and SGDT1, two source side transistor layers SGSB0 and SGSB1, two drain side dummy word line layers DD0 and DD1, two source side dummy word line layers DS0 and DS1, dummy word line layers DU and DL, one hundred and sixty two word line layers WL0-WL161 for connecting to data memory cells, and dielectric layers DL.

Other embodiments can implement more or less than the numbers described above for FIG. 4D. In one embodiment, SGD0 and SGD1 are connected together; and SGS0 and SGS1 are connected together. In other embodiments, more or less number of SGDs (greater or lesser than two) are connected together, and more or less number of SGS devices (greater or lesser than two) connected together.

In one embodiment, erasing the memory cells is performed using gate induced drain leakage (GIDL), which includes generating charge carriers at the GIDL generation transistors such that the carriers get injected into the charge trapping layers of the NAND strings to change threshold voltage of the memory cells. FIG. 4D shows two GIDL generation transistors at each end of the NAND string. In other embodiments there may be more or less than two GIDL generation transistors at each end of the NAND string.

Embodiments that use GIDL at both sides of the NAND string may have GIDL generation transistors at both sides. Embodiments that use GIDL at only the drain side of the NAND string may have GIDL generation transistors only at the drain side. Embodiments that use GIDL at only the source side of the NAND string may have GIDL generation transistors only at the source side.

FIG. 4D shows two GIDL generation transistors (SGDT0, SGDT1, SGSB0 and SGSB1) at each end of the NAND string. In an embodiment, charge carriers are only generated by GIDL at one of the two GIDL generation transistors at each end of the NAND string. In an embodiment, based on process variations during manufacturing one of the two GIDL generation transistors at an end of the NAND string is best suited for GIDL.

For example, the GIDL generation transistors have an abrupt PN junction to generate the charge carriers for GIDL and, during fabrication, a phosphorous diffusion is performed at the polysilicon channel of the GIDL generation transistors. In some cases, the GIDL generation transistor with the shallowest phosphorous diffusion is the GIDL generation transistor that generates the charge carriers during erase. However, in some embodiments charge carriers can be generated by GIDL at multiple GIDL generation transistors at a particular side of the NAND string.

Memory holes/vertical columns 428 and 430 are depicted protruding through the drain side select layers, source side select layers, dummy word line layers, GIDL generation transistor layers and word line layers. In an embodiment, each memory hole/vertical column includes a vertical NAND string. Below the memory holes/vertical columns and the layers listed below is substrate 464, an insulating film 466 on the substrate, and source line SL. The NAND string of memory hole/vertical column 428 has a source end at a bottom of the stack and a drain end at a top of the stack. As in FIG. 4C, FIG. 4D show vertical memory hole/column 428 connected to bit line 442 via connector 468.

For ease of reference, drain side select layers, source side select layers, dummy word line layers, GIDL generation transistor layers and data word line layers collectively are referred to as conductive layers.

In an embodiment, the conductive layers are made from a combination of TiN and Tungsten. In other embodiments, other materials can be used to form the conductive layers, such as doped polysilicon, metal such as Tungsten, metal silicide, such as nickel silicide, tungsten silicide, aluminum silicide or the combination thereof.

In some embodiments, different conductive layers can be formed from different materials. Between conductive layers are dielectric layers DL. In one embodiment, the dielectric layers are made from $SiO_2$. In other embodiments, other dielectric materials can be used to form the dielectric layers.

The non-volatile memory cells are formed along memory holes/vertical columns which extend through alternating conductive and dielectric layers in the stack. In one embodiment, the memory cells are arranged in NAND strings. The word line layers WL0-W161 connect to memory cells (also called data memory cells). Dummy word line layers connect to dummy memory cells.

A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0 and SGD1 are used to electrically connect and disconnect NAND strings from bit lines. Source side select layers SGS0 and SGS1 are used to electrically connect and disconnect NAND strings from the source line SL.

FIG. 4D shows that the memory array is implemented as a two tier architecture, with the tiers separated by a Joint Area. In some instances, etching so many word line layers intermixed with dielectric layers is expensive and/or challenging. To ease this burden, an embodiment includes laying down a first stack of word line layers (e.g., WL0-WL80) alternating with dielectric layers, laying down the Joint Area, and laying down a second stack of word line layers (e.g., WL81-WL161) alternating with dielectric layers. The Joint Area is positioned between the first stack and the second stack. In an embodiment, Joint Areas are made from the same materials as the word line layers. In other embodiments, there is no Joint Area or there can be multiple Joint Areas.

Figure 4E:
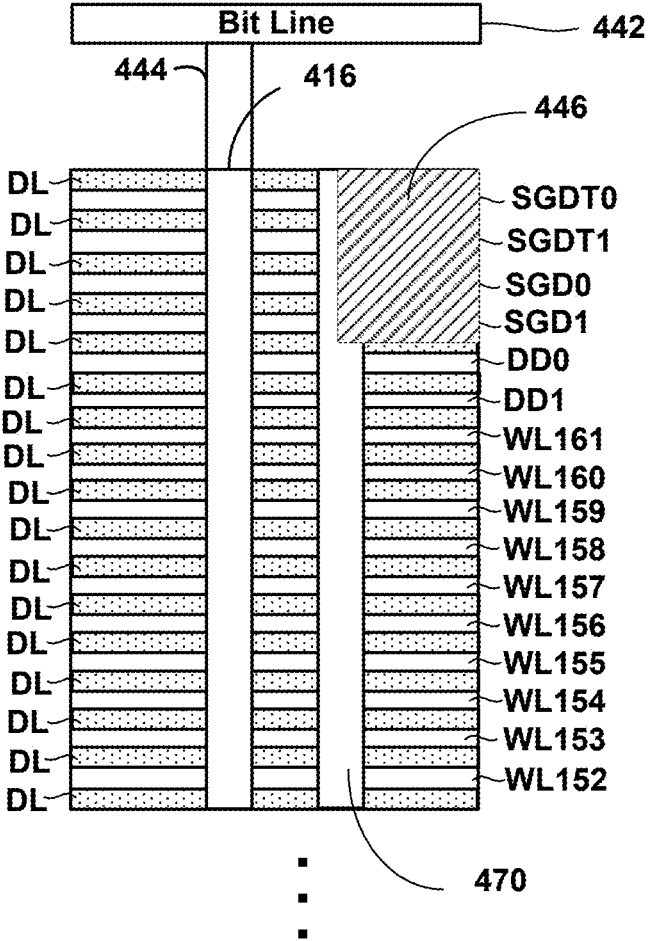
FIG. 4E depicts a cross sectional view of a portion of one embodiment of a block of memory cells.

FIG. 4E depicts a portion of one embodiment of a three dimensional memory array 202 showing a cross-sectional view along line BB of FIG. 4C. This cross sectional view cuts through memory holes/vertical columns (NAND strings) 416 and 470 of region 454 (see FIG. 4C). FIG. 4E shows the same alternating conductive and dielectric layers as FIG. 4D.

FIG. 4E also shows isolation region 446. Isolation regions 446, 448, 450 and 452) occupy space that would have been used for a portion of the memory holes/vertical columns/NAND strings. For example, isolation region 446 occupies space that would have been used for a portion of memory hole/vertical column 470. More specifically, a portion (e.g., half the diameter) of vertical column 470 has been removed in layers SGDT0, SGDT1, SGD0, and SGD1 to accommodate isolation region 446.

Thus, although most of vertical column 470 is cylindrical (with a circular cross section), the portion of vertical column 470 in layers SGDT0, SGDT1, SGD0, and SGD1 has a semi-circular cross section. In an embodiment, after the stack of alternating conductive and dielectric layers is formed, the stack is etched to create space for the isolation region and that space is then filled in with $SiO_2$. This structure allows for separate control of SGDT0, SGDT1, SGD0, and SGD1 for regions 454, 456, 458, 460, and 462.

Figure 4F:
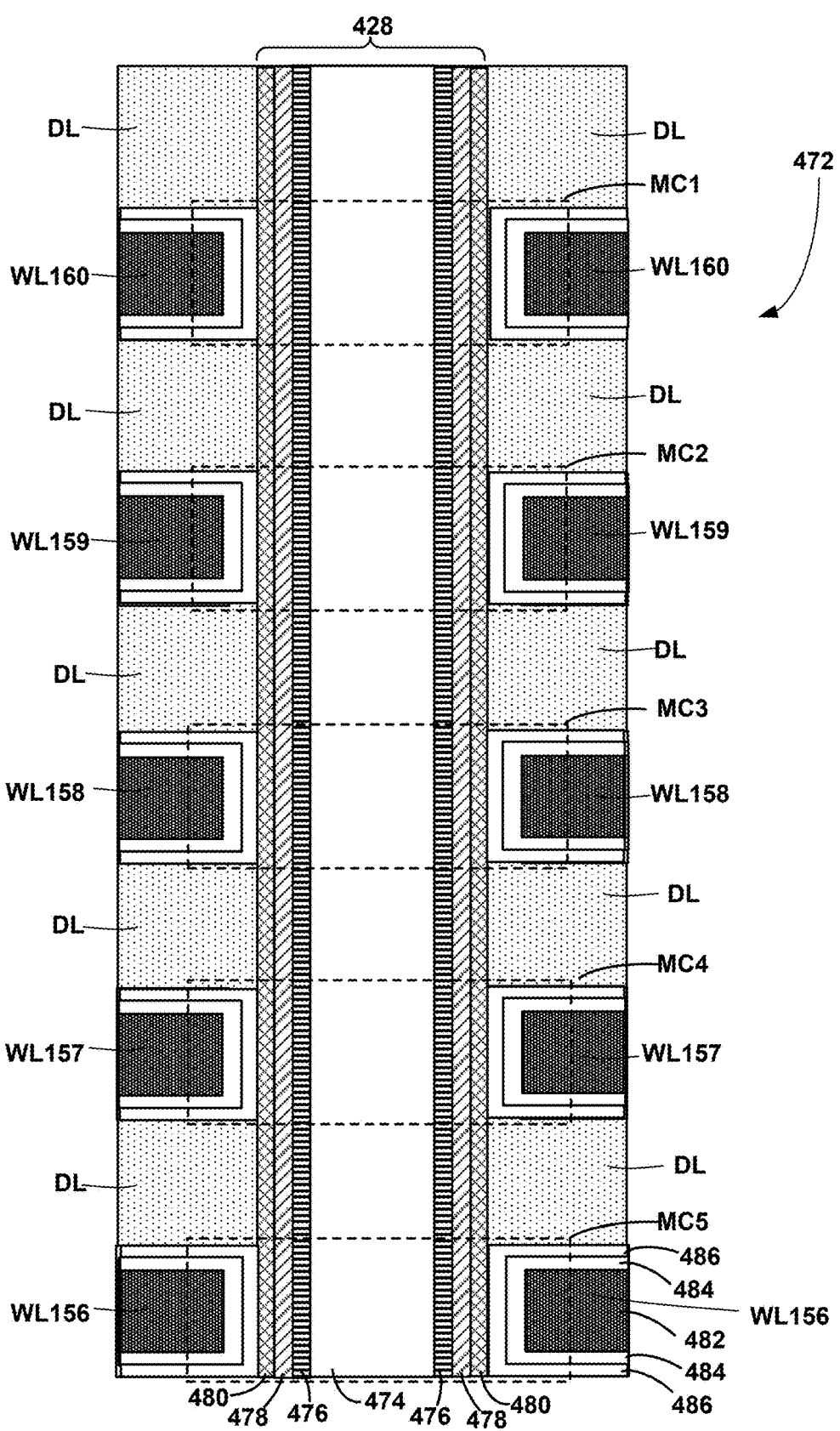
FIG. 4F is a cross sectional view of one embodiment of a vertical column of memory cells.

FIG. 4F depicts a cross sectional view of region 472 of FIG. 4D that includes a portion of memory hole/vertical column 428. In an embodiment, the memory holes/vertical columns are round. However, in other embodiments other shapes can be used. In an embodiment, memory hole/vertical column 428 includes an inner core layer 474 that is made of a dielectric, such as $SiO_2$. Other materials can also be used.

Surrounding inner core 474 is polysilicon channel 476. Materials other than polysilicon can also be used. Note that it is the channel 476 that connects to the bit line and the source line SL. Surrounding channel 476 is a tunneling dielectric 478. In an embodiment, tunneling dielectric 478 has an ONO structure. Surrounding tunneling dielectric 478 is charge trapping layer 480, such as (for example) Silicon Nitride. Other memory materials and structures can also be used. The technology described herein is not limited to any particular material or structure.

FIG. 4F depicts dielectric layers DL as well as word line layers WL160, WL159, WL158, WL157, and WL156. Each of the word line layers includes a word line region 482 surrounded by an aluminum oxide layer 484, which is surrounded by a blocking oxide layer 486. In other embodiments, the blocking oxide layer can be a vertical layer parallel and adjacent to charge trapping layer 480. The physical interaction of the word line layers with the vertical column forms the memory cells. Thus, in an embodiment a memory cell includes channel 476, tunneling dielectric 478, charge trapping layer 480, blocking oxide layer 486, aluminum oxide layer 484 and word line region 482.

For example, word line layer WL160 and a portion of memory hole/vertical column 428 constitute a memory cell MC1. Word line layer WL159 and a portion of memory hole/vertical column 428 constitute a memory cell MC2. Word line layer WL158 and a portion of memory hole/vertical column 428 constitute a memory cell MC3. Word line layer WL157 and a portion of memory hole/vertical column 428 constitute a memory cell MC4. Word line layer WL156 and a portion of memory hole/vertical column 428 constitute a memory cell MC5. In other architectures, a memory cell may have a different structure. However, the memory cell would still be the storage unit.

When a memory cell is programmed, electrons are stored in a portion of the charge trapping layer 480 which is associated with the memory cell. These electrons are drawn into the charge trapping layer 480 from the channel 476, through the tunneling dielectric 478, in response to an appropriate voltage on word line region 482. The threshold voltage (Vth) of a memory cell is increased in proportion to the amount of stored charge.

In an embodiment, the programming is achieved through Fowler-Nordheim tunneling of the electrons into the charge trapping layer. During an erase operation, the electrons return to the channel or holes are injected into the charge trapping layer to recombine with electrons. In an embodiment, erasing is achieved using hole injection into the charge trapping layer via a physical mechanism such as GIDL.

Figure 4G:
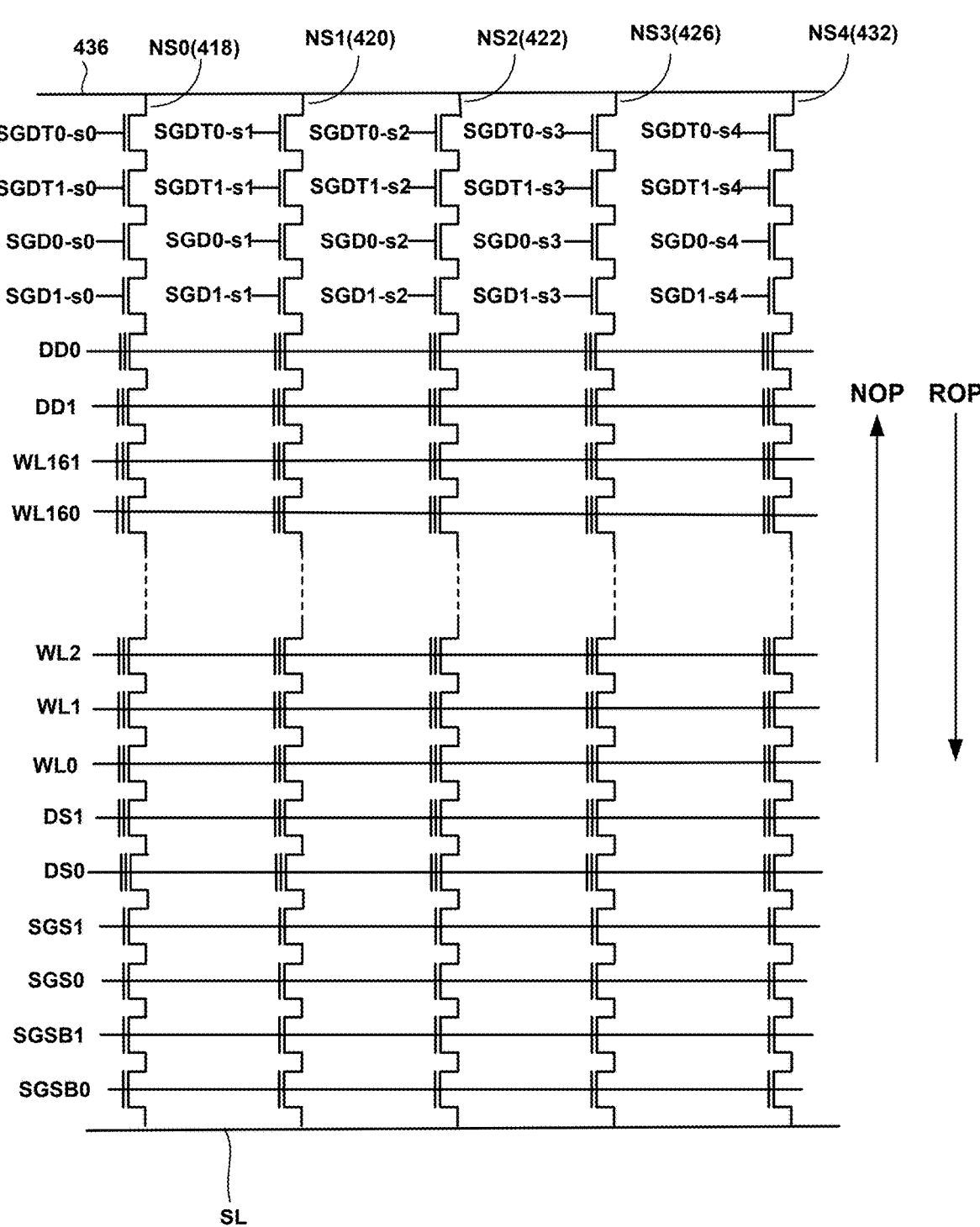
FIG. 4G is a schematic of a plurality of NAND strings in multiple regions of a same block.

FIG. 4G is a schematic diagram of a portion of the three dimensional memory array 202 depicted in in FIGS. 4B-4F. FIG. 4G shows physical data word lines WL0-WL161 running across the entire block. The structure of FIG. 4G corresponds to a portion 412 in Block 2 of FIG. 4B, including bit line 436. Within the block, in an embodiment each bit line is connected to five NAND strings, one in each of regions 454, 456, 458, 460, 462.

Thus, FIG. 4G shows bit line 436 connected to NAND string NS0 (which corresponds to memory hole/vertical column 418 of region 454), NAND string NS1 (which corresponds to memory hole/vertical column 420 of region 456), NAND string NS2 (which corresponds to vertical column 422 of region 458), NAND string NS3 (which corresponds to memory hole/vertical column 426 of region 460), and NAND string NS4 (which corresponds to memory hole/vertical column 432 of region 462).

Drain side select line/layer SGD0 is separated by isolation regions 446, 448, 450 and 452 to form SGD0-s0, SGD0-s1, SGD0-s2, SGD0-s3 and SGD0-s4 to separately connect to and independently control regions 454, 456, 458, 460, 462. Similarly, drain side select line/layer SGD1 is separated by isolation regions 446, 448, 450 and 452 to form SGD1-s0, SGD1-s1, SGD1-s2, SGD1-s3 and SGD1-s4 to separately connect to and independently control regions 454, 456, 458, 460, 462.

Drain side GIDL generation transistor control line/layer SGDT0 is separated by isolation regions 446, 448, 450 and 452 to form SGDT0-s0, SGDT0-s1, SGDT0-s2, SGDT0-s3 and SGDT0-s4 to separately connect to and independently control regions 454, 456, 458, 460, 462.

Drain side GIDL generation transistor control line/layer SGDT1 is separated by isolation regions 446, 448, 450 and 452 to form SGDT1-s0, SGDT1-s1, SGDT1-s2, SGDT1-s3 and SGDT1-s4 to separately connect to and independently control regions 454, 456, 458, 460, 462.

Each set of drain side select lines SGD0-s0 and SGD1-s0, SGD0-s1 and SGD1-s1, SGD0-s2 and SGD1-s2, SGD0-s3 and SGD1-s3, and SGD0-s4 and SGD1-s4 can be independently selected of the others. Each set of drain side select lines SGD0-s0 and SGD1-s0, SGD0-s1 and SGD1-s1, SGD0-s2 and SGD1-s2, SGD0-s3 and SGD1-s3, and SGD0-s4 and SGD1-s4 connects to a group of NAND strings in the block. Only one NAND string of each group is depicted in FIG. 4G. These four sets of drain side select lines correspond to four sub-blocks.

A first sub-block corresponds to those vertical NAND strings controlled by the set of drain side select lines SGD0-s0 and SGD1-s0. A second sub-block corresponds to those vertical NAND strings controlled by the set of drain side select lines SGD0-s1 and SGD1-s1. A third sub-block corresponds to those vertical NAND strings controlled by the set of drain side select lines SGD0-s2 and SGD1-s2. A fourth sub-block corresponds to those vertical NAND strings controlled by the set of drain side select lines SGD0-s3 and SGD1-s3. A fifth sub-block corresponds to those vertical NAND strings controlled by the set of drain side select lines SGD0-s4 and SGD1-s4. FIG. 4G only shows NAND strings connected to bit line 436. However, a full schematic of the block would show every bit line and five vertical NAND strings (that are in separate regions) connected to each bit line.

Although the example memories of FIGS. 4B-4G are three dimensional memory arrays that include vertical NAND strings with charge-trapping material, other (2D and 3D) memory arrays also can be used with the technology described herein.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate.

Figure 5A:
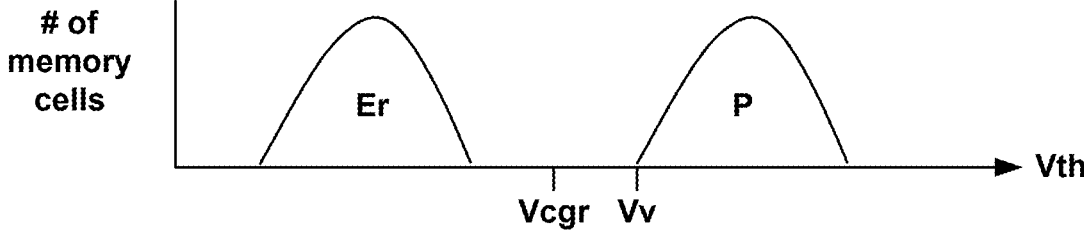
FIGS. 5A-5D are diagrams each depicting example threshold voltage distributions.

FIG. 5A is a diagram of example threshold voltage versus number of memory cells, and illustrates example threshold voltage distributions for the memory array when each memory cell stores one bit of data per memory cell. Memory cells that store one bit of data per memory cell data are referred to as single level cells ("SLC").

FIG. 5A shows two threshold voltage distributions: Er and P. Threshold voltage distribution Er corresponds to an erased data state, and threshold voltage distribution P corresponds to a programmed data state. Memory cells that have threshold voltages in threshold voltage distribution Er are in the erased data state. Memory cells that have threshold voltages in threshold voltage distribution P are in the programmed data state.

In an embodiment, erased memory cells store data "1" and programmed memory cells store data "0." FIG. 5A depicts read reference voltage VCGR. By testing (e.g., performing one or more sense operations) whether the threshold voltage of a given memory cell is above or below VCGR, the system can determine whether a memory cells is erased (state Er) or programmed (state P). FIG. 5A also depicts verify reference voltage Vv. In some embodiments, when programming memory cells to data state P, the system will test whether those memory cells have a threshold voltage greater than or equal to Vv.

In general, during read operations, a selected word line is connected to read reference voltage VCGR, and a conduction current of the memory cell is measured to determine whether the memory cell turned ON (conducted current) in response to the voltage applied to the word line. If the conduction current is measured to be greater than a certain value, then it is assumed that the memory cell turned ON and the threshold voltage of the memory cell is less than the voltage applied to the word line.

In contrast, if the conduction current is not measured to be greater than the certain value, then it is assumed that the memory cell did not turn ON and the threshold voltage of the memory cell is greater than the voltage applied to the word line. During a read process, unselected memory cells are provided with a read pass voltage $V_{READ}$ (also referred to as a bypass voltage) at their control gates so that these memory cells will operate as pass gates (e.g., conducting current regardless of whether they are programmed or erased).

Figure 5B:
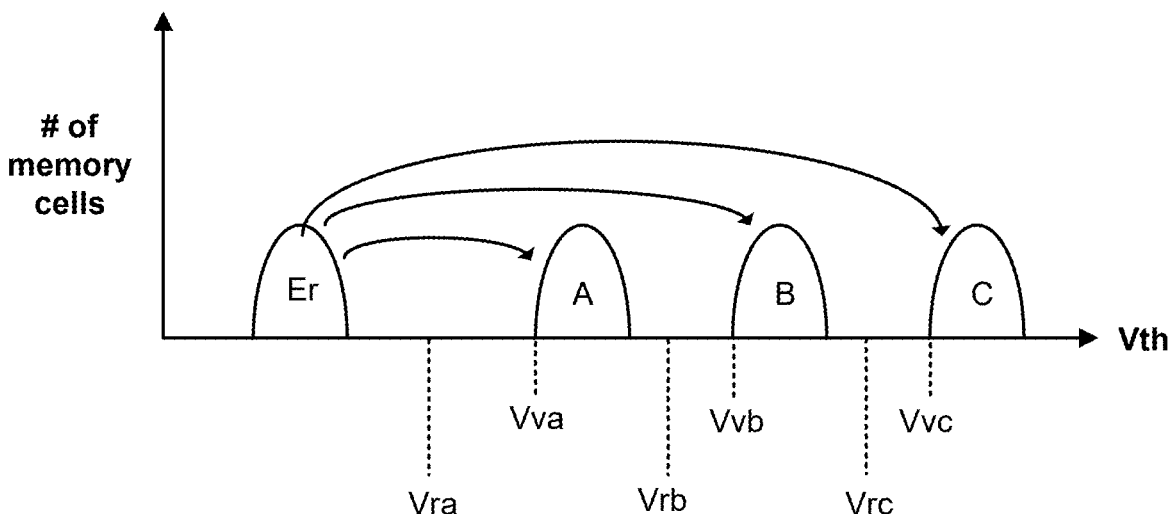
Figures 5C, 5D:
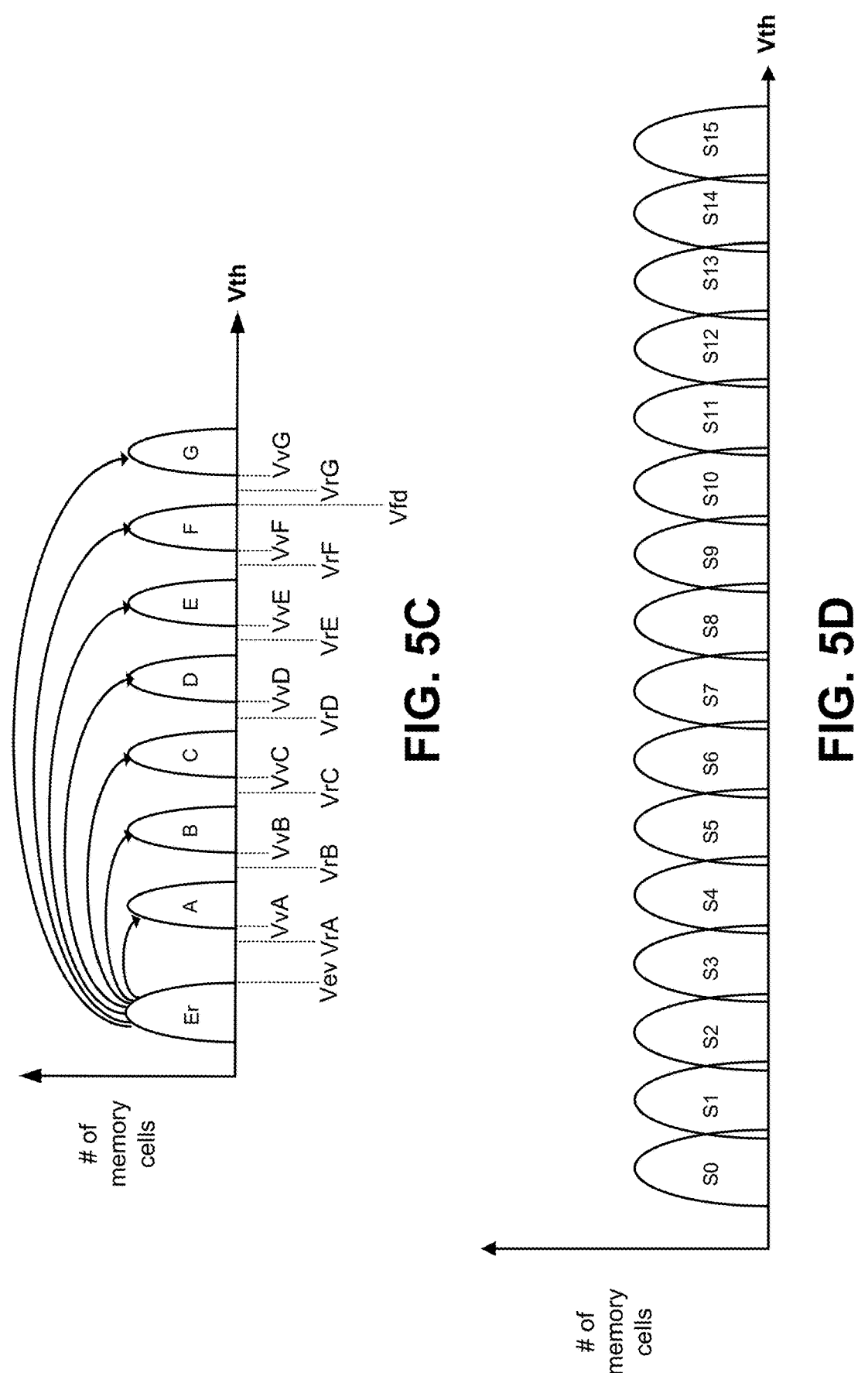

FIGS. 5B-D illustrate example threshold voltage distributions for a memory array in which each memory cell stores multiple bit per memory cell data. Memory cells that store multiple bit per memory cell data are referred to as multi-level cells (MLC). The data stored in MLC memory cells are referred to as MLC data. In the example embodiment of FIG. 5B, each memory cell stores two bits of data. Other embodiments may use other data capacities per memory cell (e.g., such as three, four, or five or more bits of data per memory cell).

FIG. 5B shows a first threshold voltage distribution Er for erased memory cells. Three threshold voltage distributions A, B and C for programmed memory cells also are depicted. In an embodiment, the threshold voltages in the distribution Er are negative and the threshold voltages in distributions A, B and C are positive. Each distinct threshold voltage distribution of FIG. 5B corresponds to predetermined values for the set of data bits.

In an embodiment, the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

|  | Er | A | B | C |
|---|---|---|---|---|
| LP | 1 | 0 | 0 | 1 |
| UP | 1 | 1 | 0 | 0 |

In an embodiment, known as full sequence programming, memory cells can be programmed from the erased data state Er directly to any of the programmed data states A, B or C. For example, a population of memory cells to be programmed may first be erased so that all memory cells in the population are in erased data state Er. Then, a programming process is used to program memory cells directly into data states A, B, and/or C.

For example, while some memory cells are being programmed from erased data state Er to data state A, other memory cells are being programmed from erased data state Er to data state B and/or from erased data state Er to data state C. The arrows of FIG. 5B represent full sequence programming. In some embodiments, data states A-C can overlap, with memory controller 104 (or control die 244) relying on error correction to identify the correct data being stored.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (erased data state) Er represents memory cells that are erased. The other seven threshold voltage distributions (data states) A-G represent memory cells that are programmed and, therefore, also are called programmed states.

Each threshold voltage distribution (data state) corresponds to predetermined values for the set of data bits. The specific relationship between the data programmed into the memory cell and the threshold voltage levels of the cell depends upon the data encoding scheme adopted for the cells.

In an embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

|  | Er | A | B | C | D | E | F | G |
|---|---|---|---|---|---|---|---|---|
| LP | 1 | 1 | 1 | 0 | 0 | 0 | 0 | 1 |
| MP | 1 | 1 | 0 | 0 | 1 | 1 | 0 | 0 |
| UP | 1 | 0 | 0 | 0 | 0 | 1 | 1 | 1 |

FIG. 5C shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (e.g., A, B, C, D, . . . ) a memory cell is in.

FIG. 5C also shows seven verify reference voltages, VvA, VvB, VvC, VvD, VvE, VvF, and VvG. In some embodiments, when programming memory cells to data states A, B, C, D, E, F and G, the system will test whether those memory cells have a threshold voltage greater than or equal to VvA, VvB, VvC, VvD, VvE, VvF and VvG, respectively. FIG. 5C also shows Vev, which is an erase verify reference voltage to test whether a memory cell has been properly erased.

In an embodiment that utilizes full sequence programming, memory cells can be programmed from the erased data state Er directly to any of the programmed data states A-G. For example, a population of memory cells to be programmed may first be erased so that all memory cells in the population are in erased data state Er. Then, a programming process is used to program memory cells directly into data states A, B, C, D, E, F, and/or G.

For example, while some memory cells are being programmed from erased data state Er to data state A, other memory cells are being programmed from erased data state Er to data state B and/or from erased data state Er to data state C, and so on. The arrows of FIG. 5C represent the full sequence programming. In some embodiments, data states A-G can overlap, with memory controller 1204 and/or control die 244 relying on error correction to identify the correct data being stored. In some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare voltages/levels VrA, VrB, VrC, VrD, VrE, VrF, and VrG, of FIG. 5C) or verify operation (e.g. see verify target voltages/levels VvA, VvB, VvC, VvD, VvE, VvF, and VvG of FIG. 5C) to determine whether a threshold voltage of the concerned memory cell has reached such level.

After applying the word line voltage, the conduction current of the memory cell is measured to determine whether the memory cell turned ON (conducted current) in response to the voltage applied to the word line. If the conduction current is measured to be greater than a certain value, then it is assumed that the memory cell turned ON and the voltage applied to the word line is greater than the threshold voltage of the memory cell.

If the conduction current is not measured to be greater than the certain value, then it is assumed that the memory cell did not turn ON and the voltage applied to the word line cell. Over time, the locations of the threshold voltage distributions may change. Such changes can increase the bit error rate, thereby increasing decoding time or even making decoding impossible. Changing the read reference voltages can help to mitigate such effects. Using ECC during the read process can fix errors and ambiguities.

In some embodiments, the threshold voltage distributions for a population of memory cells storing four bits of data per memory cell do not overlap and are separated from each other. The threshold voltage distributions of FIG. 5D will include read reference voltages and verify reference voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits.

The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

|     | S0 | S1 | S2 | S3 | S4 | S5 | S6 | S7 | S8 | S9 | S10 | S11 | S12 | S13 | S14 | S15 |
|-----|----|----|----|----|----|----|----|----|----|----|-----|-----|-----|-----|-----|-----|
| TP  | 1  | 1  | 1  | 1  | 1  | 0  | 0  | 0  | 0  | 0  | 1   | 1   | 0   | 0   | 0   | 1   |
| UP  | 1  | 1  | 0  | 0  | 0  | 0  | 0  | 0  | 1  | 1  | 1   | 1   | 1   | 1   | 0   | 0   |
| MP  | 1  | 1  | 1  | 0  | 0  | 0  | 0  | 1  | 1  | 0  | 0   | 0   | 0   | 1   | 1   | 1   |
| LP  | 1  | 0  | 0  | 0  | 1  | 1  | 0  | 0  | 0  | 0  | 0   | 1   | 1   | 1   | 1   | 1   | is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in a sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. The technology described herein can be used with different methods known in the art for verifying/reading. Other read and verify techniques known in the art can also be used.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage).

Figure 6:
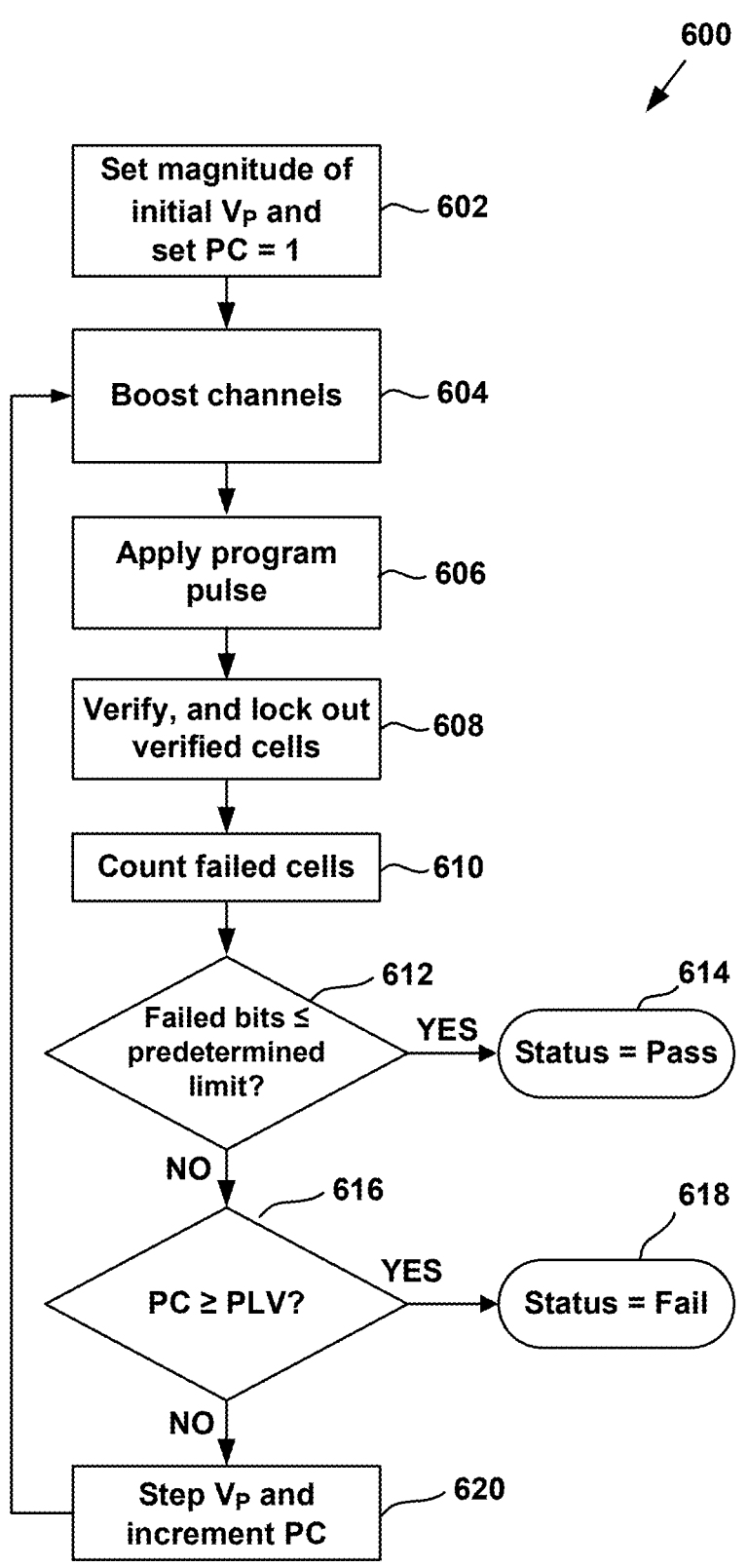
FIG. 6 is a flowchart describing an embodiment of a process for programming non-volatile memory.

Program disturb can unintentionally increase the threshold voltage of a memory cell. Likewise, read disturb can unintentionally increase the threshold voltage of a memory FIG. 6 is a flowchart describing an embodiment of a process 600 for programming a memory cell. In an example embodiment, process 600 is performed on memory die 106 (FIG. 1), memory die 200 (FIG. 2A) or memory die 242 (FIG. 2B) using the control circuits discussed above. For example, process 600 can be performed at the direction of state machine 228 (FIGS. 2A-2B).

In an embodiment, process 600 includes multiple loops, each of which includes a program phase and a verify phase. In an embodiment, process 600 also can be used to implement the full sequence programming discussed above. Additionally, process 600 can be used to implement each phase of a multi-phase programming process. In an embodiment, when implementing multi-phase programming, process 600 is used to implement any/each stage of the multi-phase programming process.

In an embodiment, the program voltage applied to the control gates (via a selected data word line) during a program operation is applied as a series of program voltage pulses. Between program voltage pulses are a set of verify pulses (e.g., voltage pulses) to perform verification. In many implementations, the magnitude of the program voltage pulses is increased with each successive pulse by a predetermined step size.

In step 602, a programming voltage ($V_P$) is initialized to a starting program voltage $V_{Pinit}$ (e.g., between about 12V to about 20V, or some other value) and a program counter PC maintained by state machine 228 is initialized at 1.

In an embodiment, a group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line also will be connected to memory cells that are supposed to be inhibited from programming.

Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming.

In step 604, NAND strings that include memory cells connected to the selected word line that are to be inhibited from programming have their channels boosted to inhibit programming. Such NAND strings are referred to herein as "unselected NAND strings." In an embodiment, the unselected word lines receive one or more boosting voltages (e.g., ~7-11 V) to perform boosting schemes. A program inhibit voltage is applied to the bit lines coupled the unselected NAND string.

In step 606, a program pulse having a magnitude $V_P$ is applied to the selected word line. In an embodiment, the group of memory cells being concurrently programmed are all connected to the same word line (the selected word line). If a memory cell is to be programmed, then the corresponding bit line coupled to the memory cell is grounded. If a memory cell should remain at its current threshold voltage, then the corresponding bit line coupled to the memory cell is connected to an inhibit voltage (e.g., Vpass) (e.g., 10V) to inhibit programming.

In step 608, the program pulse is applied to all memory cells connected to the selected word line so that all of the connected memory cells are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 608, the memory cells are verified using the appropriate set of verify reference voltages to perform one or more verify operations. In an embodiment, the verify step includes testing whether memory cells being programmed have successfully reached their target data state. In an embodiment, memory cells that have reached their target states are locked out from further programming. In an embodiment, step 608 is performed by testing whether the threshold voltages of the memory cells selected for programming have reached the appropriate verify reference voltage.

In step 610, the memory system counts the number of memory cells that have not yet reached their respective target threshold voltage distribution. That is, the system counts the number of memory cells that have so far failed the verify process. This counting can be done by controller 104 (FIG. 1), state machine 228 (FIGS. 2A-2B), control die 244 (FIG. 2B), or other logic. In the remaining discussion, the term "Controller Device" may be one or more of controller 104 (FIG. 1), state machine 228 (FIGS. 2A-2B), control die 244 (FIG. 2B) or other similar controller device.

In an embodiment, each of sense amps 218 (FIG. 2A) stores the status (pass/fail) of their respective memory cells. In an embodiment, one total count reflects the total number of memory cells currently being programmed that have failed the last verify step. In another embodiment, separate counts are kept for each data state.

In step 612, a determination is made whether the count from step 610 is less than or equal to a predetermined limit. In an embodiment, the predetermined limit is the number of bits that can be corrected by error correction codes (ECC) during a read process for the page of memory cells.

If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process.

In some embodiments, the predetermined limit used in step 614 is below the number of bits that can be corrected by error correction codes (ECC) during a read process to allow for future/additional errors. When programming less than all of the memory cells for a page, or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, the limit changes based on the number of errors already counted for the page, the number of program-erase cycles performed or other criteria.

If the number of failed memory cells is not less than the predetermined limit, then the programming process continues at step 616 and the program counter PC is checked against a program limit value (PLV). Examples of program limit values include 6, 12, 16, 20 and 30, although other values can be used. If the program counter PC is greater than or equal to program limit value PLV, then the program process is considered to have failed and a status of FAIL is reported in step 618.

If the program counter PC is not greater than or equal to program limit value PLV, then the process continues at step 620 in which the Program Counter PC is incremented by 1 and program voltage $V_P$ is stepped up to the next magnitude. For example, the next program pulse will have a magnitude greater than the previous pulse by a program step size $\Delta V_P$ (e.g., a step size of between about 0.1V to about 1.0V, or some other value).

Process 600 then loops back to step 604, channels of NAND strings that include memory cells connected to the selected word line that are to be inhibited from programming are boosted to inhibit programming, and at step 606 another program pulse is applied to the selected word line so that another iteration (steps 604-620) of programming process 600 is performed. Each pass through steps 604-620 is referred to herein as a "program loop."

Referring again to FIG. 4G, in an embodiment the word lines of a memory block are programmed in a sequential order, which can proceed in two different and opposite directions. In an embodiment (indicated with the arrow pointing upward), sometimes referred to as a normal order programming (NOP), the word lines are programmed in sequence starting from a source side of the memory block and proceeding towards a drain side of the memory block.

In another embodiment, (indicated with the arrow pointing downward), sometimes referred to as a reverse order programming (ROP), the word lines are programmed in sequence starting from a drain side of the memory block and proceeding towards a source side of the memory block.

In general, during verify operations and read operations, the selected word line is connected to a voltage (one example of a reference signal), a level of which is specified for each read operation (e.g., read compare levels VrA, VrB, VrC, VrD, VrE, VrF, and VrG, of FIG. 5C) or verify operation (e.g. verify target levels VvA, VvB, VvC, VVD, VVE, VVF, and VvG of FIG. 5C) to determine whether a threshold voltage of the selected memory cell has reached such level.

In an embodiment, after an appropriate read or verify voltage is applied to a selected word line, a conduction current of the memory cell is measured to determine whether the memory cell turned ON (conducts current) in response to the voltage applied to the word line. If the conduction current is measured to be greater than a reference value, then it is assumed that the memory cell turned ON and the voltage applied to the word line is greater than the threshold voltage of the memory cell.

If the conduction current is measured to be not greater than the reference value, then the memory cell did not turn ON and the voltage applied to the word line is not greater than the threshold voltage of the memory cell. During a read or verify process, the unselected memory cells are provided with one or more read pass voltages Vread (e.g., 7V) (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate at which the memory cell discharges or charges a dedicated capacitor in a sense amplifier. In another example, the conduction current of the selected memory cell allows (or fails to allow) the NAND string that includes the memory cell to discharge a corresponding bit line. The voltage on the bit line is measured after a period of time to see whether or not the bit line has been discharged. Note that the technology described herein can be used with different methods known in the art for verifying/reading. Other read and verify techniques known in the art also can be used.

As described above, at step 606 a program pulse is applied to the selected word line, and at step 608 memory cells coupled to the selected word line are verified using an appropriate set of verify reference voltages to perform one or more verify operations. Steps 606 and 608 are part of an iterative loop in which program pulses are applied as a series of program pulses that step up in magnitude, with intervening verify reference pulses between consecutive program pulses. Such an iterative loop is referred to herein as a "program-verify iteration."

Figure 7:
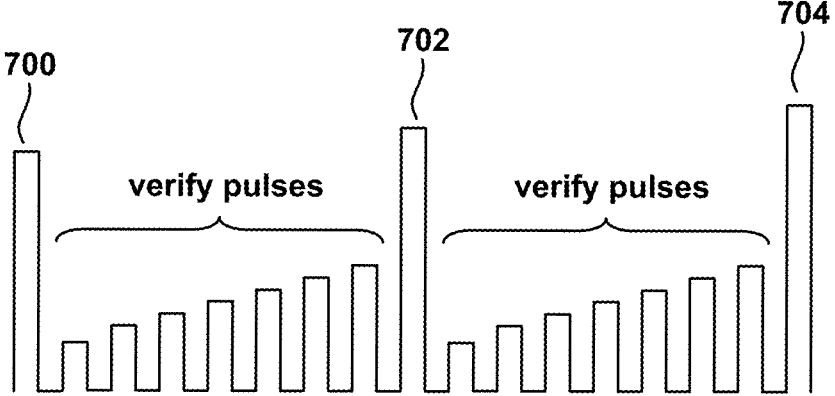
FIG. 7 depicts a word line voltage during programming and verify operations.

FIG. 7 illustrates an example of such program-verify pulses applied to a selected word line. In particular, FIG. 7 depicts program pulses 700, 702 and 704 applied to the selected word line during three successive iterations of step 606 of FIG. 6. Between program pulses 700, 702 and 704 verify pulses are applied to the selected word line during three successive program-verify iterations of steps 606-608 of FIG. 6 to determine whether threshold voltages of the memory cells are greater than the respective verify reference voltages.

In an embodiment, memory cells are erased prior to programming. Erasing is the process of changing the threshold voltage of one or more memory cells from a programmed data state to an erased data state. For example, changing the threshold voltage of one or more memory cells from state P to state Er of FIG. 5A, from states A/B/C to state Er of FIG. 5B, from states A-G to state Er of FIG. 5C or from states S1-S15 to state S0 of FIG. 5D.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the memory cells. Herein, this is referred to as p-well erase.

Another approach to erasing memory cells is to generate a gate induced drain leakage ("GIDL") current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage of memory cells.

When power is applied to a memory die in a memory system a startup sequence is required to load various initialization information so that the memory die can operate properly. The initialization information may include parameter information, trimming information, bad block/bad column information and other similar initialization information that is unique to each particular memory die. This initialization sequence is sometimes referred to as a power on read ("POR") sequence.

In embodiments, during a POR sequence the initialization information is read from a special block of memory cells inside the memory die. As used herein, a block of memory cells of the memory die that is dedicated to storing this initialization information is referred to as a ROMBLK. As used herein, a block of memory cells of the memory die that stores various test data and a backup copy of the initialization information is referred to as a USERROM.

In embodiments, the ROMBLK is programmed at the factory when the memory die is first manufactured and tested and includes initialization information that is required for the memory die to operate properly. On the user side, when the memory die is put into use, the memory controller first reads the initialization information from the ROMBLK and transfers the read initialization information to a data latch in the memory die during the POR sequence.

Figure 8:
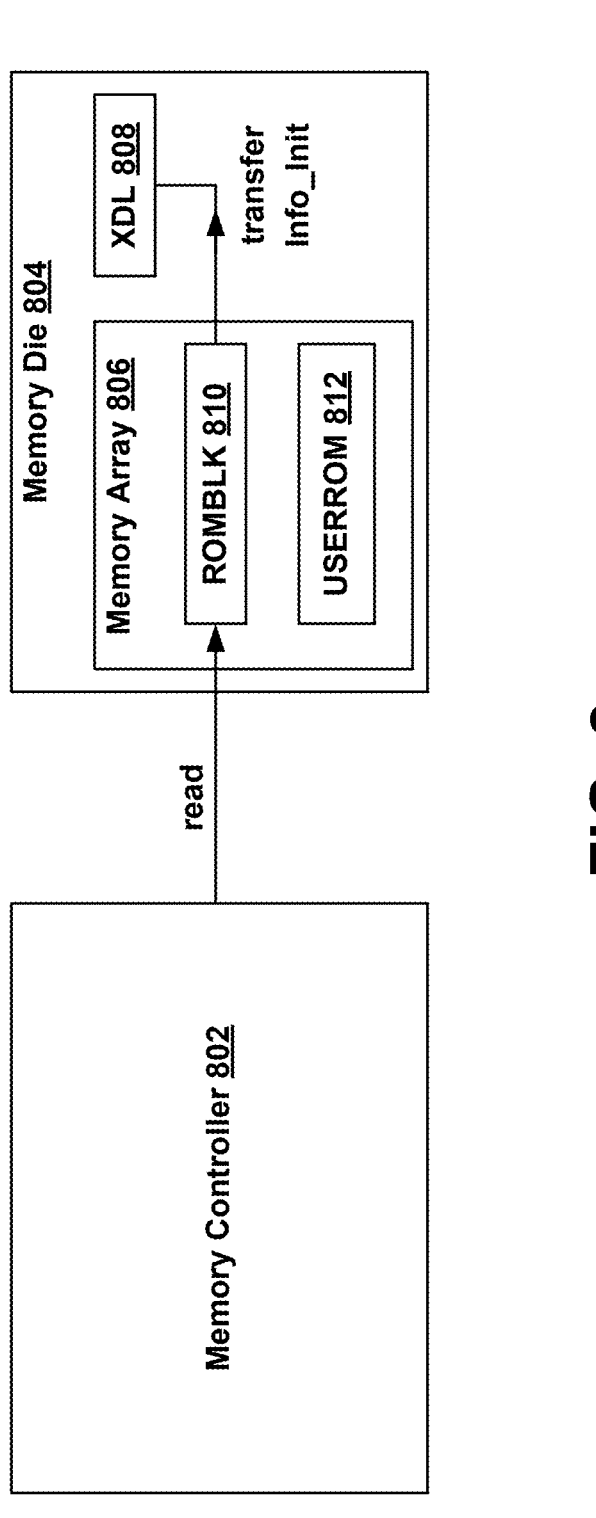
FIG. 8 is a simplified diagram that depicts a memory system that includes a memory controller coupled to a memory die.

For example, FIG. 8 is a simplified diagram that depicts a memory system 800 that includes a memory controller 802 coupled to a memory die 804, which includes a memory array 806 and an interface latch 808 (e.g., XDL) configured to store/latch data from memory controller 802. In an embodiment, memory die 804 includes a ROMBLK 810 and also may include a USERROM 812.

Although a single ROMBLK 810 is depicted in FIG. 8, in some embodiments memory die 804 may include multiple ROMBLKS 810 (e.g., a primary ROMBLK and a secondary (backup) ROMBLK). In embodiments, USERROM 812 stores various test data and a backup copy of the initialization information that is stored in ROMBLK 810.

In embodiments, memory controller 802 may be any of memory controller 104 of FIG. 1, control die 244 of FIG. 2B, and control die 304 of FIGS. 3A-3B, and memory die 804 may be any of memory die 106 of FIG. 1, memory die 200 of FIG. 2A, memory die 242 of FIG. 2B, and memory die 306 of FIGS. 3A-3B.

In embodiments, during a POR sequence memory controller 802 sends a POR command to memory die 804 to read the initialization information from ROMBLK 810 and transfer the read initialization information to data latch XDL 808. In embodiments, ROMBLK 810 includes 16 KB of initialization information which are read from ROMBLK 810 and are transferred to XDL 808. In other embodiments, ROMBLK 810 may include more or less than 16 KB of initialization information data that are read from ROMBLK 810 during a POR sequence.

After memory system 800 has been deployed in the field for use, a POR sequence also is performed each time power is applied to memory system 800, and initialization information for memory die 804 is read from ROMBLK 810 and transferred to XDL 808. This read operation typically is performed successfully and memory die 804 is successfully initialized and is able to correctly perform memory operations.

In some instances, however, a POR failure occurs in which initialization information for memory die 804 cannot be read from ROMBLK 810 (or any backup ROMBLK). For example, there may be physical fault (e.g., a short) in the memory cells that make up ROMBLK 810, or some other failure may prevent correctly reading ROMBLK 810. In such instances, in response to receiving a POR command from memory controller 802, memory die 804 returns a status error code indicating that ROMBLK 810 could not be successfully read and that a POR failure has occurred.

As a result, memory die 804 is not successfully initialized and cannot perform memory operations and cannot be used. In such instances, there may be no other failure in the remaining portion of memory die 804, and there is only a failure in ROMBLK 810. That is, memory die 804 would otherwise be fully functional but the failure of ROMBLK 810 prevents access to and use of memory die 804.

A memory system 800 such as a solid state drive typically includes multiple memory die 804 (e.g., 8, 16 or some other number of memory die 804). In some embodiments of such memory systems 800, when a POR failure occurs on any memory die 804 in memory system 800, the entire memory system 800 is put into read-only mode, and the entire memory system 800 essentially becomes useless. This is extremely wasteful, because as described above in many instances the "failing" memory die 804 would be fully operational except for the ROMBLK failure.

Such system failures negatively impact a performance metric sometimes referred to as system defect parts per million ("System DPPM"). Indeed, for some particular applications (e.g., automotive and enterprise customers), System DPPM must be kept below a specified limit (e.g., <10). However, as a result of POR failures, System DPPM may exceed the limit and therefore may be unable to meet the specification.

Technology is described for recovering a memory die that fails to initialize in response to a power on read command. In an embodiment, initialization parameters for a memory die are stored on the memory die, and a backup copy of the initialization parameters is also stored in a storage location outside the first memory die. In embodiments, the storage location outside the first memory die may be a second memory die, a memory controller coupled to the first memory die, or some other location outside the first memory die.

In embodiments, if the memory die fails to initialize in response to a power on read command, the backup copy of the initialization parameters is retrieved from the storage location, and loaded into a data register on the memory die to attempt to initialize the memory die. In embodiments, a test memory operation (e.g., a read operation) is performed on the memory die to determine if the memory die successfully initialized.

Figure 9A:
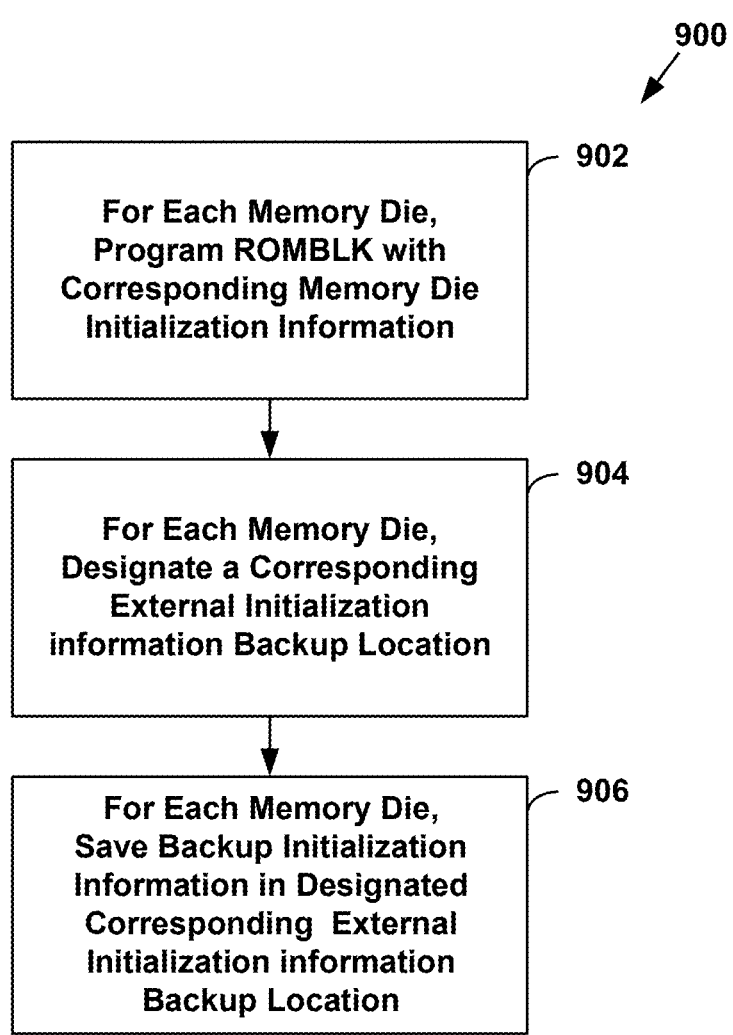
FIG. 9A is flow diagram of an example process for storing initialization information for a memory die.

FIG. 9A is flow diagram of an example process 900 for storing initialization information for a memory die. In embodiments, process 900 may be performed during manufacture and testing of memory die (e.g., following die sort testing) prior to the memory die being deployed for use by a user.

Figure 10A:
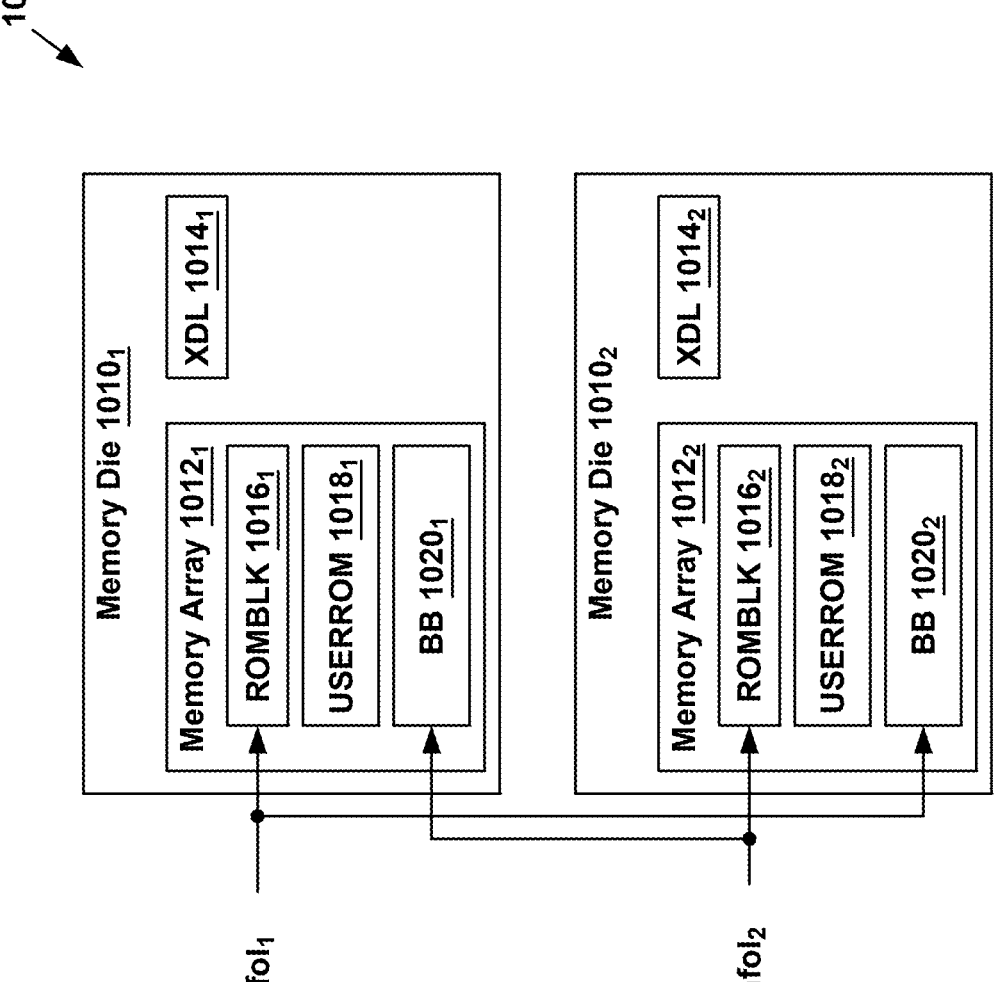
FIG. 10A is a simplified diagram of a memory system that includes a first memory die and a second memory die.

At step 902, for each memory die of a memory system, program a corresponding ROMBLK of the memory die with corresponding initialization information for the memory die. For example, FIG. 10A is a simplified diagram of a memory system 1008 that includes a first memory die $1010_1$ and a second memory die $1010_2$. Each of first memory die $1010_1$ and second memory die $1010_2$ may be any of memory die 106 of FIG. 1, memory die 200 of FIG. 2A, memory die 242 of FIG. 2B, and memory die 306 of FIGS. 3A-3B. Persons of ordinary skill in the art will understand that memory system 1008 may include more than two memory die.

In an embodiment, first memory die $1010_1$ includes a first memory array $1012_1$ and a first interface latch $1014_1$ (e.g., XDL) used for storing/latching data from a memory controller. In an embodiment, first memory array $1012_1$ includes a first ROMBLK $1016_1$ and also may include a first USER-ROM $1018_1$. In an embodiment, first memory array $1012_1$ also includes a first backup block BB $1020_1$, which may be a dedicated block of memory cells in first memory array $1012_1$.

In an embodiment, second memory die $1010_2$ includes a second memory array $1012_2$ and a second interface latch $1014_2$ (e.g., XDL) used for storing/latching data from a memory controller. In an embodiment, second memory array $1012_2$ includes a second ROMBLK $1016_2$ and also may include a second USERROM $1018_2$. In an embodiment, second memory array $1012_2$ also includes a second backup block BB $1020_2$, which may be a dedicated block of memory cells in second memory array $1012_2$.

Referring again to FIG. 9A, at step 902 for each of first memory die $1010_1$ and second memory die $1010_2$, program first ROMBLK $1016_1$ with corresponding initialization information for first memory die $1010_1$ ($InfoI_1$) and program second ROMBLK $1016_2$ with corresponding initialization information for second memory die $1010_2$ ($InfoI_2$).

At step 904 for each memory die of a memory system designate a corresponding "external" initialization information backup location. As used herein, an external initialization information backup location is a storage location that is located outside the memory die and may be used to save initialization information.

In an embodiment, a corresponding external initialization information backup location for a first memory die in a memory system is located in a corresponding second memory die in the memory system. For example, referring to FIG. 10A second backup block BB $1020_2$ of second memory die $1010_2$ is designated as a corresponding external initialization information backup location for first memory die $1010_1$, and first backup block BB $1020_1$ of first memory die $1010_1$ is designated as a corresponding external initialization information backup location for second memory die $1010_2$.

Referring again to FIG. 9A, at step 906 for each memory die of a memory system save corresponding initialization information as corresponding backup initialization information in the designated corresponding external initialization information backup location for the memory die.

Thus, referring again to FIG. 10A, corresponding initialization information for first memory die $1010_1$ ($InfoI_1$) is saved as corresponding backup initialization information for first memory die $1010_1$ ($InfoI_{1,B}$) in second backup block BB $1020_2$, and corresponding initialization information for second memory die $1010_2$ ($InfoI_2$) is saved as corresponding backup initialization information for second memory die $1010_2$ ($InfoI_{2B}$) in first backup block BB $1020_1$.

The example of FIG. 10A is of a simple memory system 1008 that includes only two memory die. Persons of ordinary skill in the art will understand that in memory systems that include more than two memory die (e.g., 8 memory die, 16 memory die, 32 memory die, etc.), the designated corresponding external initialization information backup locations may be included in any memory die of the memory system.

For example, FIG. 9B depicts various scenarios for a memory system that includes four memory die (e.g., first memory die $1010_1$, second memory die $1010_2$, third memory die $1010_3$, and fourth memory die $1010_4$) having backup blocks BB $1020_1$, BB $1020_2$, BB $1020_3$, and BB $1020_4$, respectively. Each column depicts designated corresponding external initialization information backup locations for first memory die $1010_1$, second memory die $1010_2$, third memory die $1010_3$, and fourth memory die $1010_4$.

Figure 9C:
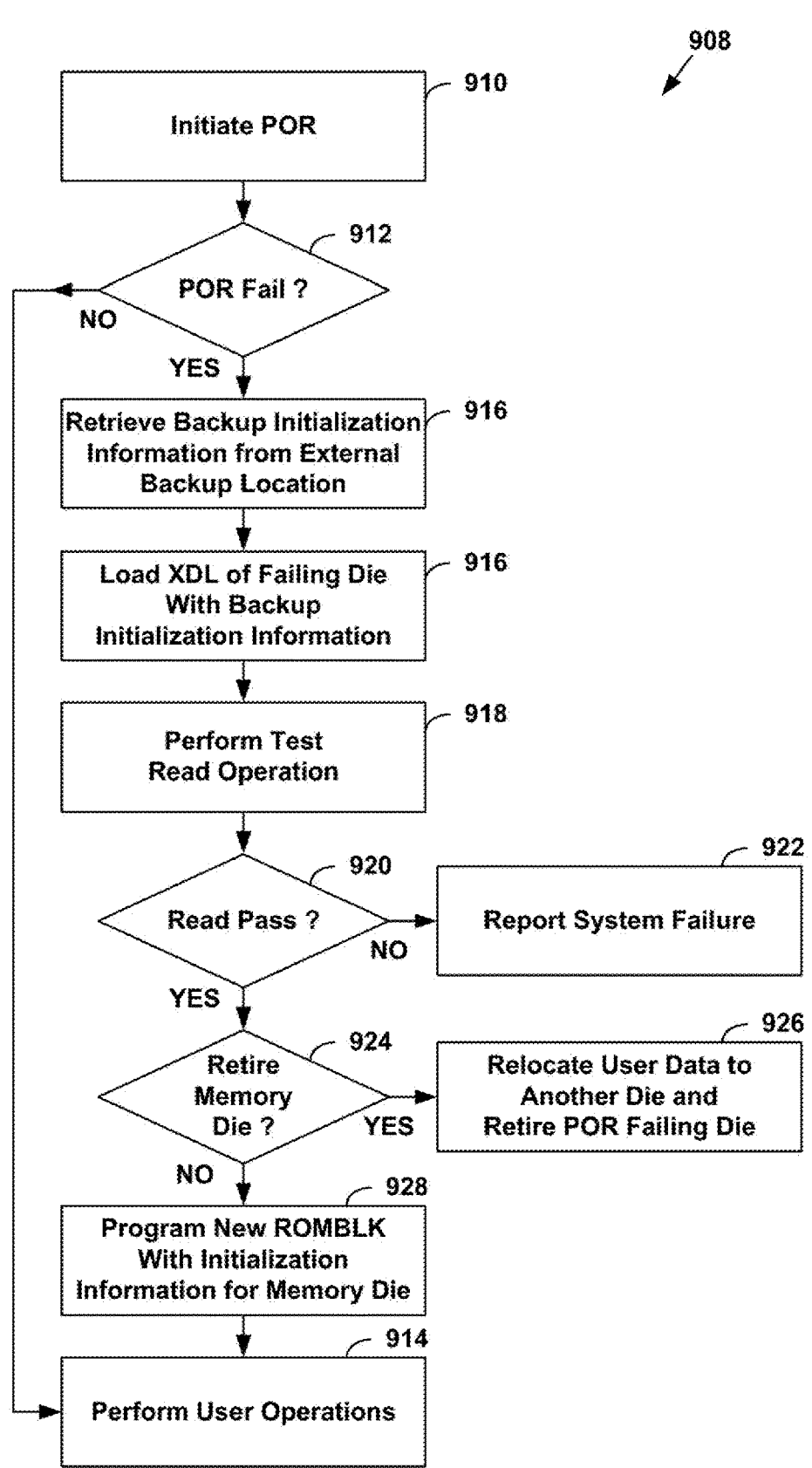
FIG. 9C is flow diagram of an example process for performing an in-field power on read sequence for a memory die.

FIG. 9C is flow diagram of an example process 908 for performing an "in-field" POR sequence for a memory die. As used herein an in-field POR sequence is a POR sequence that is performed after manufacture and testing of the memory die. For example, a POR sequence that is performed on a memory die installed in a customer application is an in-field POR sequence. In embodiments, process 908 may be performed by a memory controller (e.g., memory controller 104 of FIG. 1, control die 244 of FIG. 2B, control die 304 of FIGS. 3A-3B).

At step 910, a memory controller issues a POR command to the memory die.

At step 912, a determination is made whether the POR failed. In embodiments, in response to a POR command each memory die returns a status code indicating whether the POR passed or failed. That is, whether or not the memory die was successfully initialized using the corresponding initialization information for the memory die.

If at step 912 a determination is made that the POR did not fail, then at step 914 the memory die is operated normally and performs memory operations as requested by a user.

If, however, at step 912 a determination is made that the POR failed, then at step 916 corresponding backup initialization information for the POR failing memory die is retrieved from the designated corresponding external backup location for the memory die.

Figure 10B:
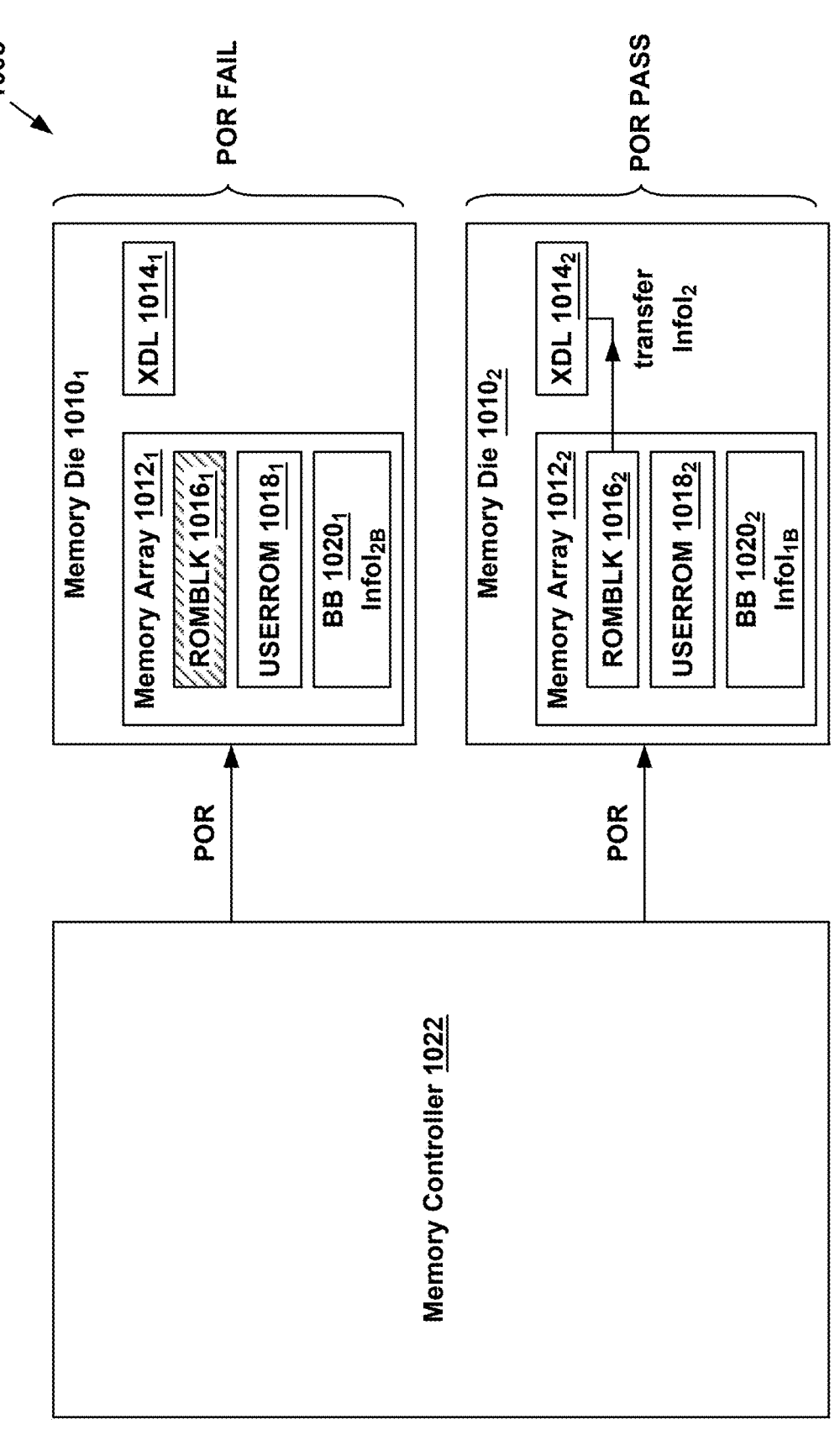
FIG. 10B is a simplified block diagram of the memory system of FIG. 10A and also including a memory controller.

To illustrate an example, FIG. 10B is a simplified block diagram of memory system 1008 of FIG. 10A and also including a memory controller 1022. In embodiments, memory controller 1022 may be any of memory controller 104 of FIG. 1, control die 244 of FIG. 2B, or control die 304 of FIGS. 3A-3B. In the illustrated example, memory controller 1022 sends POR commands to each of first memory die $1010_1$ and second memory die $1010_2$.

In response to receiving the POR commands, first memory die $1010_1$ reads corresponding initialization information $InfoI_1$ from first ROMBLK $1016_1$ and second memory die $1010_2$ reads corresponding initialization information $InfoI_2$ from second ROMBLK $1016_2$.

In the illustrated example, corresponding initialization information $InfoI_2$ is successfully read from second ROMBLK $1016_2$ and transferred to XDL $1014_2$, and the POR of second memory die $1010_2$ passes. Referring again to FIG. 9C, for second memory die $1010_2$ process 908 proceeds to step 914 and the memory die is operated normally and performs memory operations as requested by a user.

Figure 10C:
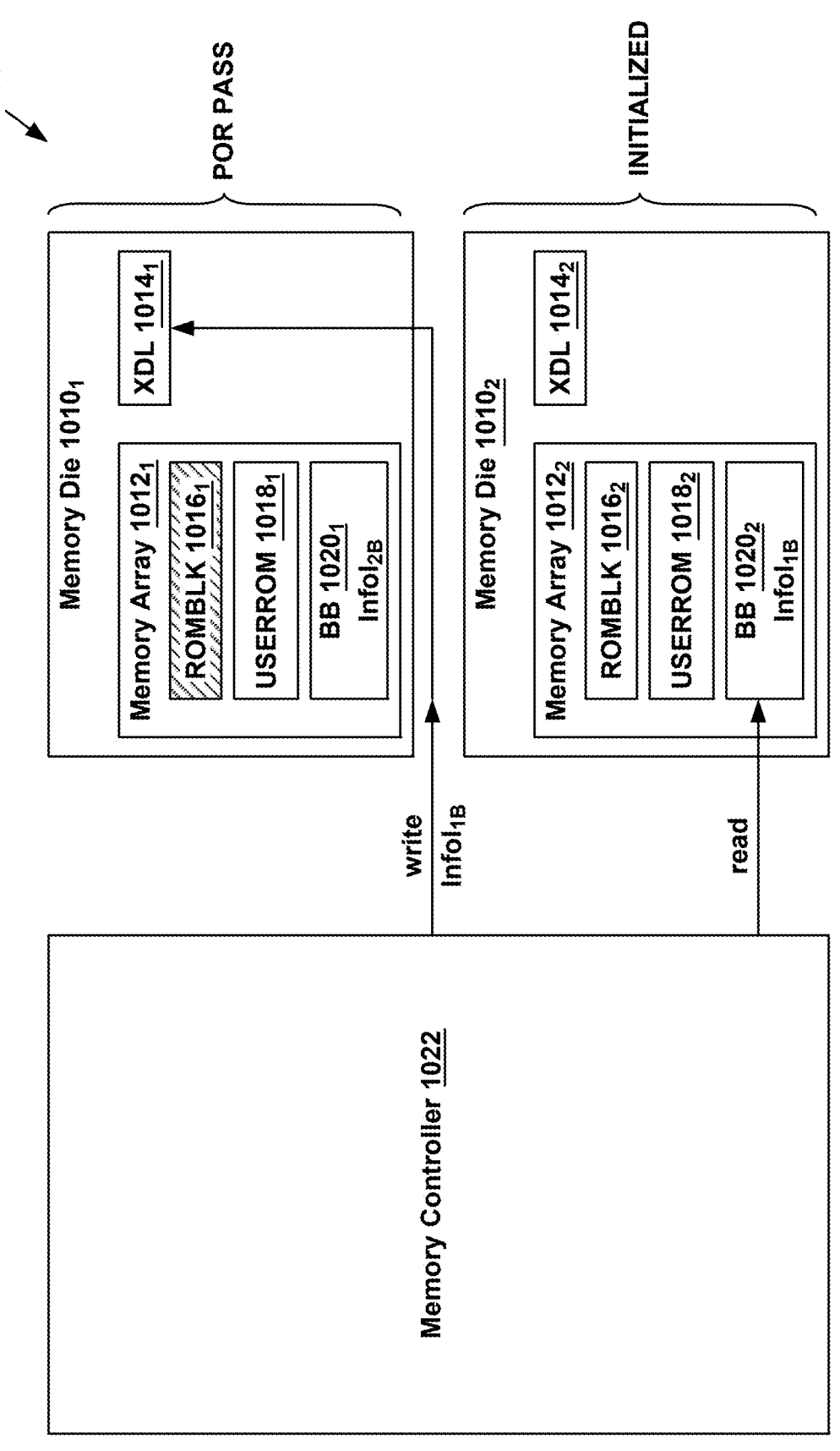
FIG. 10C is a simplified block diagram of the memory system of FIG. 10B while attempting to recover the first memory die.

Referring again to FIG. 10B, in the illustrated example the POR of first memory die $1010_1$ fails. The POR failure of first memory die $1010_1$ may be the a result of some failure of first ROMBLK $1016_1$. FIG. 10C is a simplified block diagram of the memory system of FIG. 10B while attempting to recover first memory die $1010_1$. Referring to FIGS. 9C and 10C, for first memory die $1010_1$ process 908 proceeds to step 916 and memory controller 1022 retrieves corresponding backup initialization information $InfoI_{1B}$ from designated corresponding second backup block BB $1020_2$.

At step 916, memory controller 1022 loads the corresponding backup initialization information $InfoI_{1B}$ into XDL $1014_1$ of first memory die $1010_1$.

At step 918, memory controller 1022 performs a test memory operation (e.g., a read operation) on first memory die $1010_1$. This step is performed to determine if first memory die $1010_1$ was successfully initialized in step 916.

At step 920, a determination is made if the test memory operation performed at step 918 was successful. For example, in an embodiment in which a test read operation is performed at step 918, at step 920 a determination is made if the test read operation was successful.

If at step 920 a determination is made if the test read operation was not successful, then at step 922 memory controller 1022 reports a failure of memory system 1008. In other words, the failure of first memory die $1010_1$ was a result of something other than a failure of first ROMBLK $1016_1$.

If, however, at step 920 a determination is made if the test read operation was successful, then at step 924 a determination is made whether first memory die $1010_1$ should be retired. For example, in some embodiments a user may determine that although first memory die $1010_1$ was successfully initialized by loading corresponding backup initialization information $InfoI_{1B}$ into XDL $1014_1$, the user may nevertheless determine that first memory die $1010_1$ should be retired.

If at step 924 a determination is made that first memory die $1010_1$ should be retired, then at step 926 memory controller 1022 relocates user data from first memory die $1010_1$ to another memory die in memory system 1008, and then retires first memory die $1010_1$.

If, however, at step 924 a determination is made that first memory die $1010_1$ should not be retired, then at step 928 memory controller 1022 programs an available block of memory cells on first memory die $1010_1$ with initialization information for first memory die $1010_1$, designates the programmed block as a new ROMBLK for first memory die $1010_1$, (e.g., ROMBLK $1016_{1N}$) and de-designates ROMBLK $1016_1$ as the ROMBLK for first memory die $1010_1$.

In an embodiment, the initialization information programmed into new ROMBLK $1016_{1N}$ may be corresponding backup initialization information $InfoI_{1B}$ that was read from designated corresponding second backup block BB $1020_2$. In an alternative embodiment, the initialization information programmed into new ROMBLK $1016_{1N}$ may be a backup copy of initialization information $InfoI_{1B}$ that is stored in first USERROM $1018_1$.

Referring again to FIG. 9C, at step 914 first memory die $1010_1$ is operated normally and performs memory operations as requested by a user.

Without wanting to be bound by any particular theory, it is believed that example processes 900 and 908 described above and facilitated by the memory system embodiments of FIGS. 10A-10C may be used to recover memory die from an in-field POR failure, and may reduce System DPPM.

In the embodiment of FIGS. 10A-10C, external initialization information backup locations are located in memory die in the memory system. In an alternative embodiment, external initialization information backup locations are located in a memory controller in the memory system.

Figure 11A:
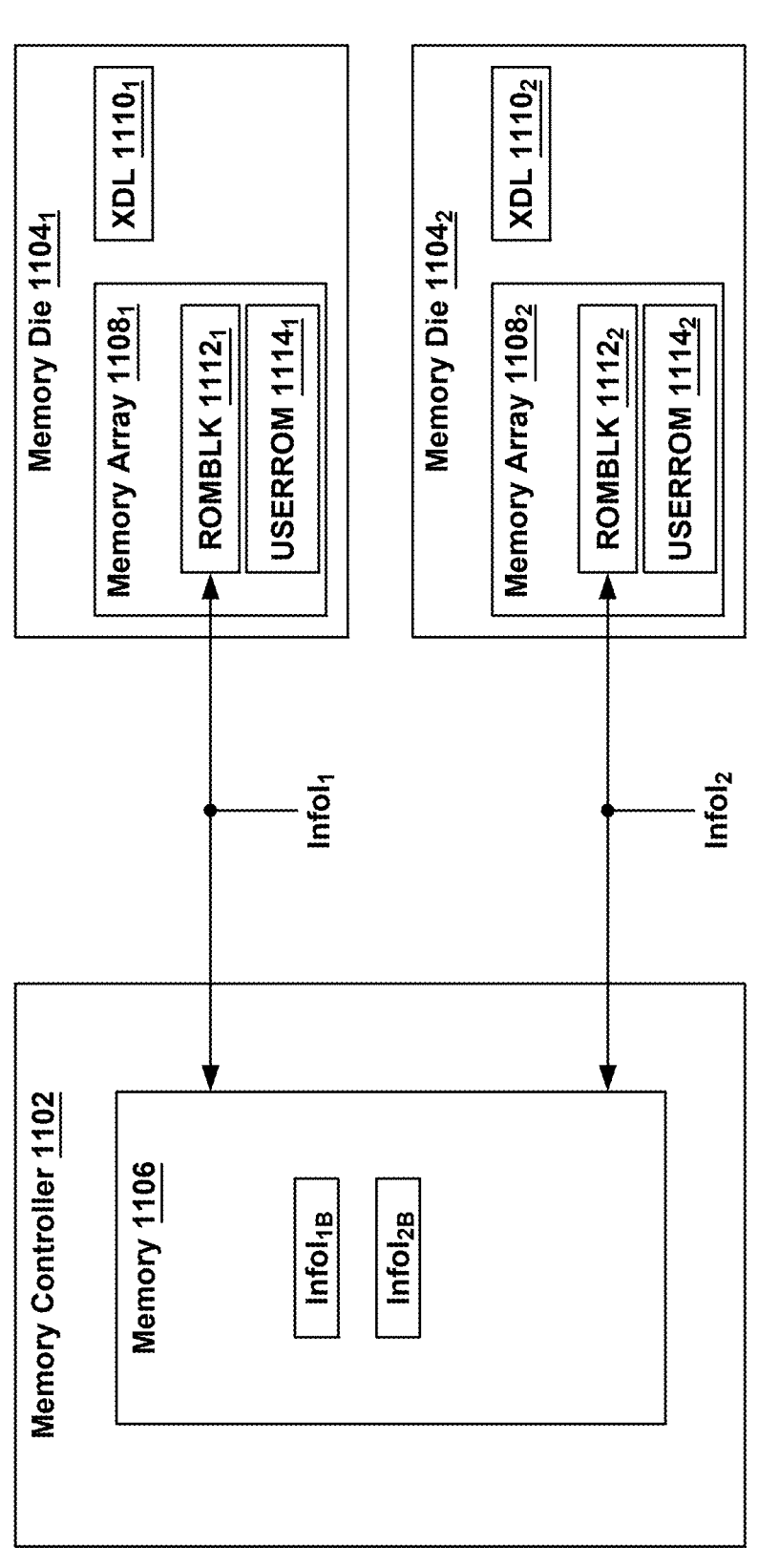
FIG. 11A is a simplified diagram of a memory system that includes a memory controller, a first memory die and a second memory die.

For example, FIG. 11A is a simplified diagram of a memory system 1100 that includes a memory controller 1102, a first memory die $1104_1$ and a second memory die $1104_2$. In embodiments, each of first memory die $1104_1$ and second memory die $1104_2$ may be any of memory die 106 of FIG. 1, memory die 200 of FIG. 2A, memory die 242 of FIG. 2B, and memory die 306 of FIGS. 3A-3B. In embodiments, memory controller 1102 may be any of memory controller 104 of FIG. 1, control die 244 of FIG. 2B, or control die 304 of FIGS. 3A-3B. Persons of ordinary skill in the art will understand that memory system 1100 may include more than two memory die.

In an embodiment, memory controller 1102 includes a memory 1106 (e.g., RAM) that is used as an external initialization information backup location for first memory die $1104_1$ and a second memory die $1104_2$.

In an embodiment, first memory die $1104_1$ includes a first memory array $1108_1$ and a first interface latch $1110_1$ (e.g., XDL) used for storing/latching data from memory controller 1102. In an embodiment, first memory array $1108_1$ includes a first ROMBLK $1112_1$ and also may include a first USER-ROM $1114_1$.

In an embodiment, second memory die $1104_2$ includes a second memory array $1108_2$ and a second interface latch $1110_2$ (e.g., XDL) used for storing/latching data from memory controller 1102. In an embodiment, second memory array $1104_2$ includes a second ROMBLK $1112_2$ and also may include a second USERROM $1114_2$.

Referring to FIGS. 9A and 11A, at step 902 corresponding initialization information for first memory die $1104_1$ (InfoI$_1$) is stored in first ROMBLK $1112_1$ and corresponding initialization information for second memory die $1104_2$ (InfoI$_2$) is stored in second ROMBLK $1112_1$.

At step 904, memory 1106 of memory controller 1102 is designated as a corresponding external initialization information backup location for first memory die $1104_1$, and also is designated as a corresponding external initialization information backup location for second memory die $1104_2$.

At step 906, corresponding initialization information for first memory die $1104_1$ (InfoI$_1$) is stored in memory 1106 as corresponding backup initialization information for first memory die $1104_1$ (InfoI$_{1B}$), and corresponding initialization information for second memory die $1010_2$ (InfoI$_2$) is stored in memory 1106 as corresponding backup initialization information for second memory die $1104_2$ (InfoI$_{2B}$).

Figure 11B:
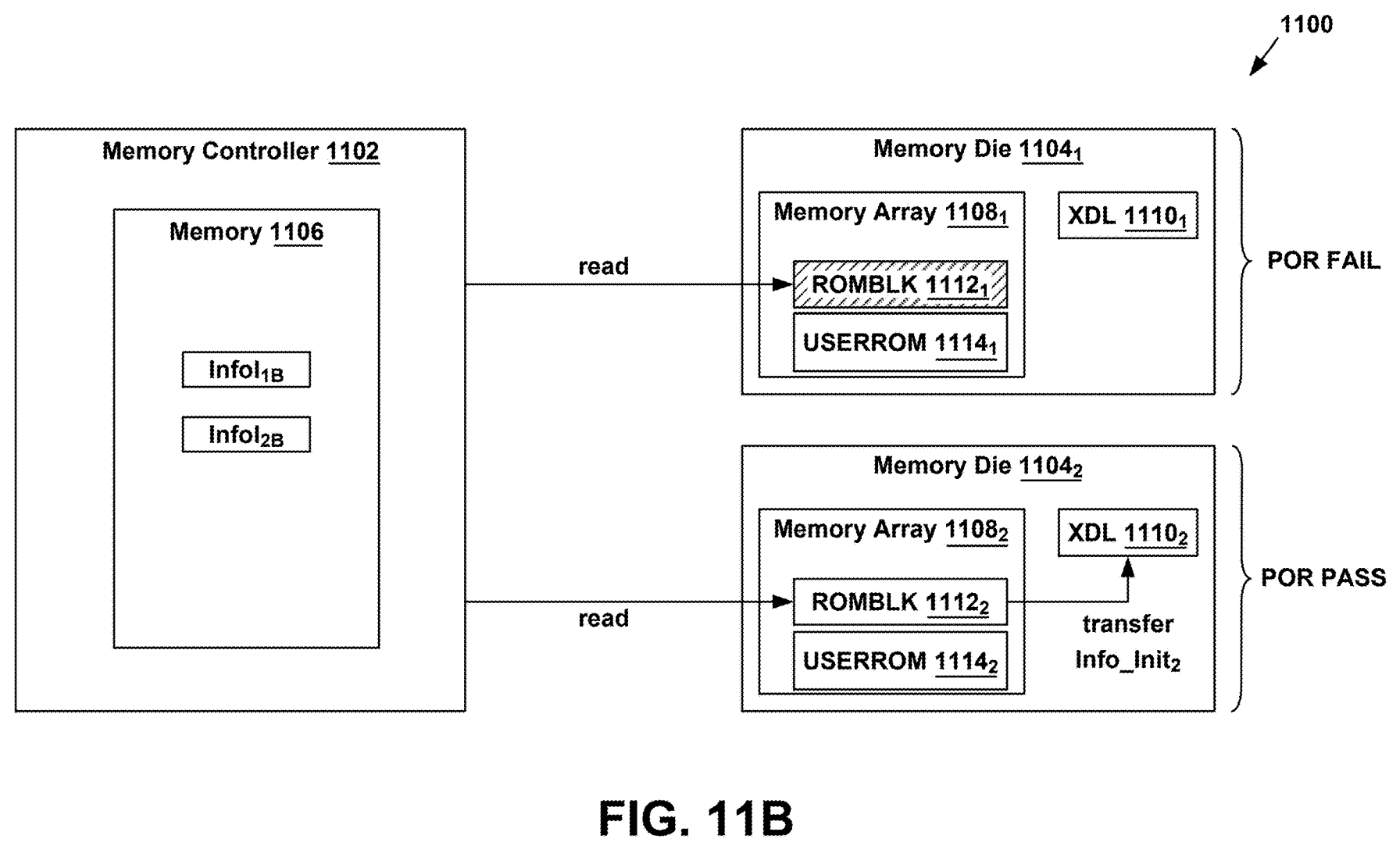

FIG. 11B depicts memory system 1100 of FIG. 11A during an in-field POR sequence. Referring to FIGS. 9C and 11B, at step 910 memory controller 1102 sends POR commands to each of first memory die $1104_1$ and second memory die $1104_2$.

In response to receiving the POR commands, first memory die $1104_1$ reads corresponding initialization information InfoI$_1$ from first ROMBLK $1112_1$ and second memory die $1104_2$ reads corresponding initialization information InfoI$_2$ from second ROMBLK $1112_2$.

In the illustrated example, corresponding initialization information InfoI$_2$ is successfully read from second ROMBLK $1112_2$ and transferred to XDL $1110_2$, and the POR of second memory die $1104_2$ passes. Referring again to FIG. 9C, for second memory die $1104_2$ process 908 proceeds to step 914 and the memory die is operated normally and performs memory operations as requested by a user.

Figure 11C:
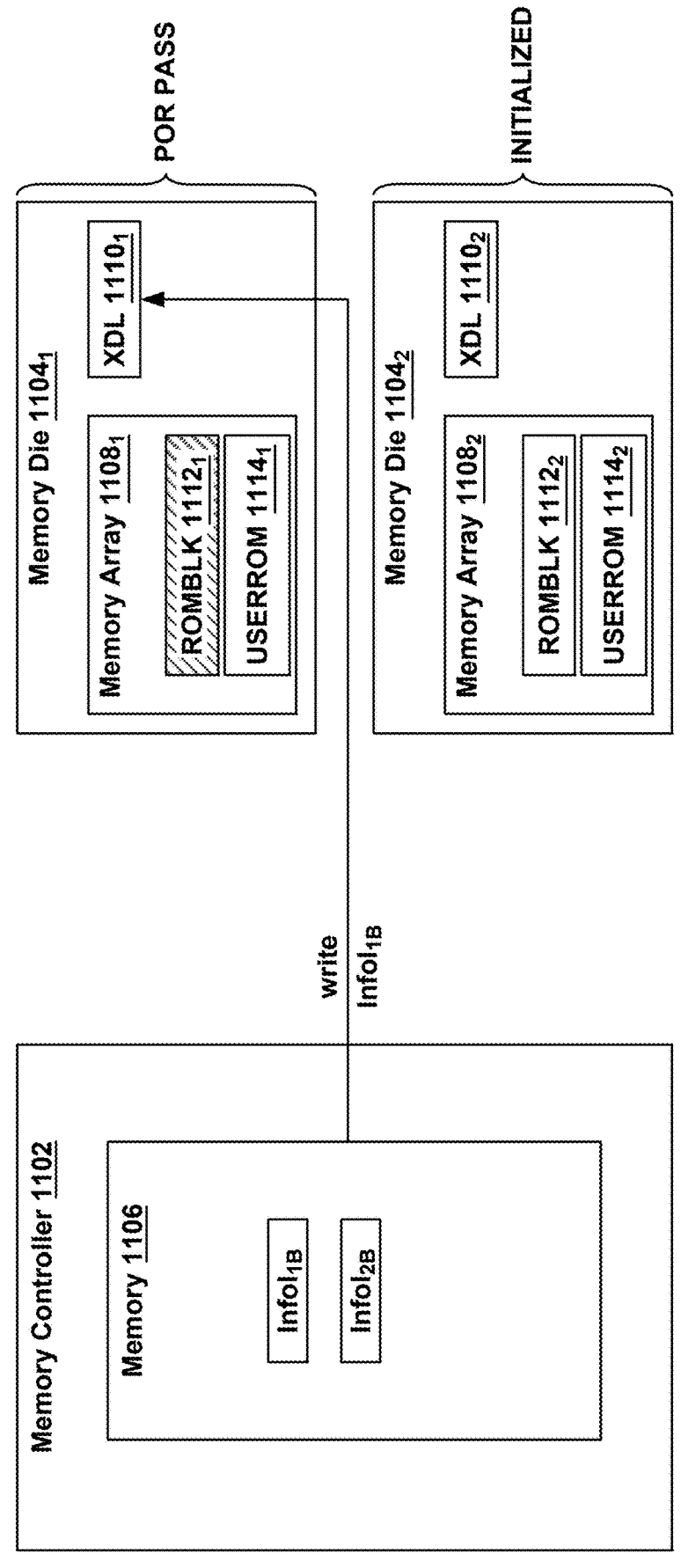
FIG. 11C is a simplified block diagram of the memory system of FIG. 11B while attempting to recover the first memory die.

Referring again to FIG. 11B, in the illustrated example the POR of first memory die $1104_1$ fails. The POR failure of first memory die $1104_1$ may be the a result of some failure of first ROMBLK $1112_1$. FIG. 11C is a simplified block diagram of the memory system of FIG. 11B while attempting to recover first memory die $1104_1$. Referring to FIGS. 9C and 11C, for first memory die $1104_1$ process 908 proceeds to step 916 and memory controller 1102 retrieves corresponding backup initialization information InfoI$_{1B}$ from corresponding external initialization information backup location memory 1106 of memory controller 1102.

At step 916, memory controller 1102 loads the corresponding backup initialization information InfoI$_{1B}$ into XDL $1110_1$ of first memory die $1104_1$.

At step 918, memory controller 1102 performs a test memory operation (e.g., a read operation) on first memory die $1104_1$. This step is performed to determine if first memory die $1104_1$ was successfully initialized in step 916.

At step 920, a determination is made if the test memory operation performed at step 918 was successful. For example, in an embodiment in which a test read operation is performed at step 918, at step 920 a determination is made if the test read operation was successful.

If at step 920 a determination is made if the test read operation was not successful, then at step 922 memory controller 1102 reports a failure of memory system 1100. In other words, the failure of first memory die $1104_1$ was a result of something other than a failure of first ROMBLK $1112_1$.

If, however, at step 920 a determination is made if the test read operation was successful, then at step 924 a determination is made whether first memory die $1104_1$ should be retired. For example, in some embodiments a user may determine that although first memory die $1104_1$ was successfully initialized by loading corresponding backup initialization information InfoI$_{1B}$ into XDL $1110_1$, the user may nevertheless determine that first memory die $1104_1$ should be retired.

If at step 924 a determination is made that first memory die $1104_1$ should be retired, then at step 926 memory controller 1102 relocates user data from first memory die $1104_1$ to another memory die in memory system 1100, and then retires first memory die $1104_1$.

If, however, at step 924 a determination is made that first memory die $1104_1$ should not be retired, then at step 928 memory controller 1102 programs an available block of memory cells on first memory die $1104_1$ with initialization information for first memory die $1104_1$, designates the programmed block as a new ROMBLK for first memory die $1104_1$, (e.g., ROMBLK $1112_{1N}$) and de-designates ROMBLK $1112_1$ as the ROMBLK for first memory die $1104_1$.

In an embodiment, the initialization information programmed into new ROMBLK 1112 IN may be corresponding backup initialization information InfoI$_{1B}$ that was read from memory 1106. In an alternative embodiment, the initialization information programmed into new ROMBLK 1112 IN may be a backup copy of initialization information InfoI$_{1B}$ that is stored in first USERROM $1114_1$.

Referring again to FIG. 9C, at step 914 first memory die $1104_1$ is operated normally and performs memory operations as requested by a user.

Without wanting to be bound by any particular theory, it is believed that example processes 900 and 908 described above and facilitated by the memory system embodiments of FIGS. 11A-11C may be used to recover memory die from an in-field POR failure, and may reduce System DPPM.

In the example embodiments of FIGS. 9A-11C described above, backup initialization information for a memory die of a first memory system is stored in another memory die of the first memory system, or a memory of a memory controller of the first memory system. Persons of ordinary skill in the art will understand that in other embodiments backup initialization information for a memory die of a first memory system may be stored in another memory die of a second memory system, or a memory of a memory controller of a second memory system.

In the example embodiments of FIGS. 9A-11C described above, backup initialization information for a memory die are stored in another memory die or a memory of a memory controller, and then in response to an in-field POR sequence failure the stored backup initialization information is retrieved and then loaded into an XDL of the failing memory die. In an alternative embodiment, in response to an in-field POR sequence failure of a memory die, some or all of the corresponding initialization information from another memory die are loaded into an XDL of the failing memory die to attempt to initialize the failing memory die.

Figure 12A:
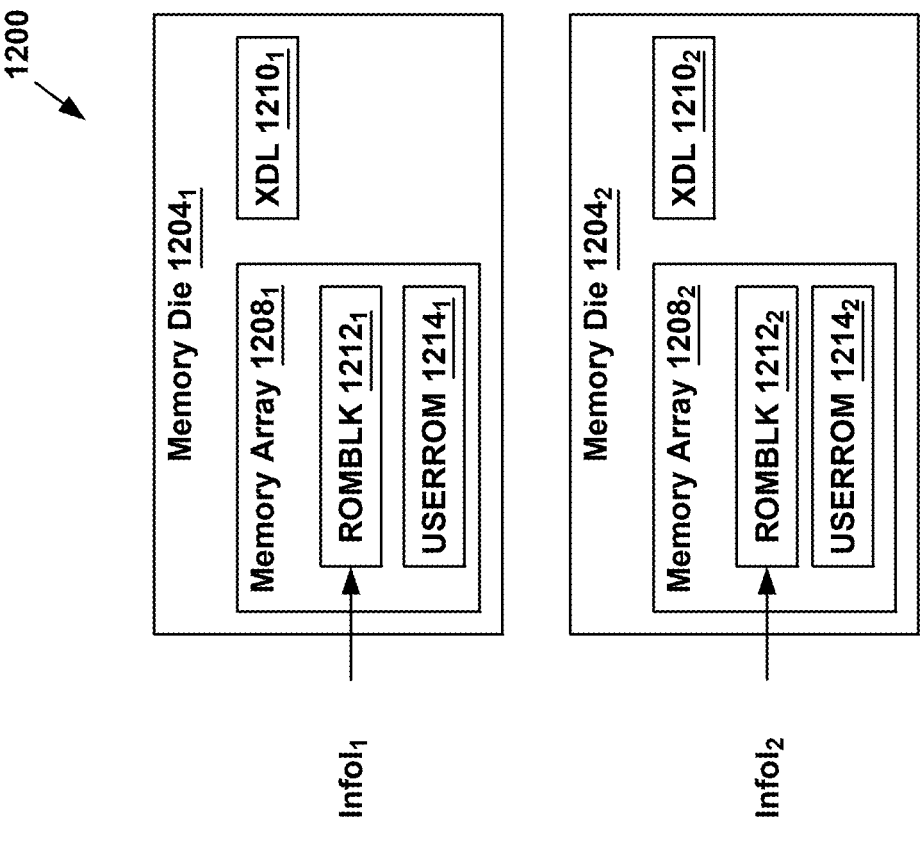
FIG. 12A is a simplified diagram of a memory system that includes a memory controller, a first memory die and a second memory die.

For example, FIG. 12A is a simplified diagram of a memory system 1200 that includes a memory controller 1202, a first memory die $1204_1$ and a second memory die $1204_2$. In embodiments, each of first memory die $1204_1$ and second memory die $1204_2$ may be any of memory die 106 of FIG. 1, memory die 200 of FIG. 2A, memory die 242 of FIG. 2B, and memory die 306 of FIGS. 3A-3B. In embodiments, memory controller 1202 may be any of memory controller 104 of FIG. 1, control die 244 of FIG. 2B, or control die 304 of FIGS. 3A-3B. Persons of ordinary skill in the art will understand that memory system 1200 may include more than two memory die.

In an embodiment, memory controller 1202 includes a memory 1206 (e.g., RAM).

In an embodiment, first memory die $1204_1$ includes a first memory array $1208_1$ and a first interface latch $1210_1$ (e.g., XDL) used for storing/latching data from memory controller 1202. In an embodiment, first memory array $1208_1$ includes a first ROMBLK $1212_1$ and also may include a first USER-ROM $1214_1$.

In an embodiment, second memory die $1204_2$ includes a second memory array $1208_2$ and a second interface latch $1210_2$ (e.g., XDL) used for storing/latching data from memory controller 1202. In an embodiment, second memory array $1204_2$ includes a second ROMBLK $1212_2$ and also may include a second USERROM $1214_2$.

In an embodiment, corresponding initialization information for first memory die $1204_1$ ($InfoI_1$) is stored in first ROMBLK $1212_1$ and corresponding initialization information for second memory die $1204_2$ ($InfoI_2$) is stored in second ROMBLK $1212_1$.

Figure 12B:
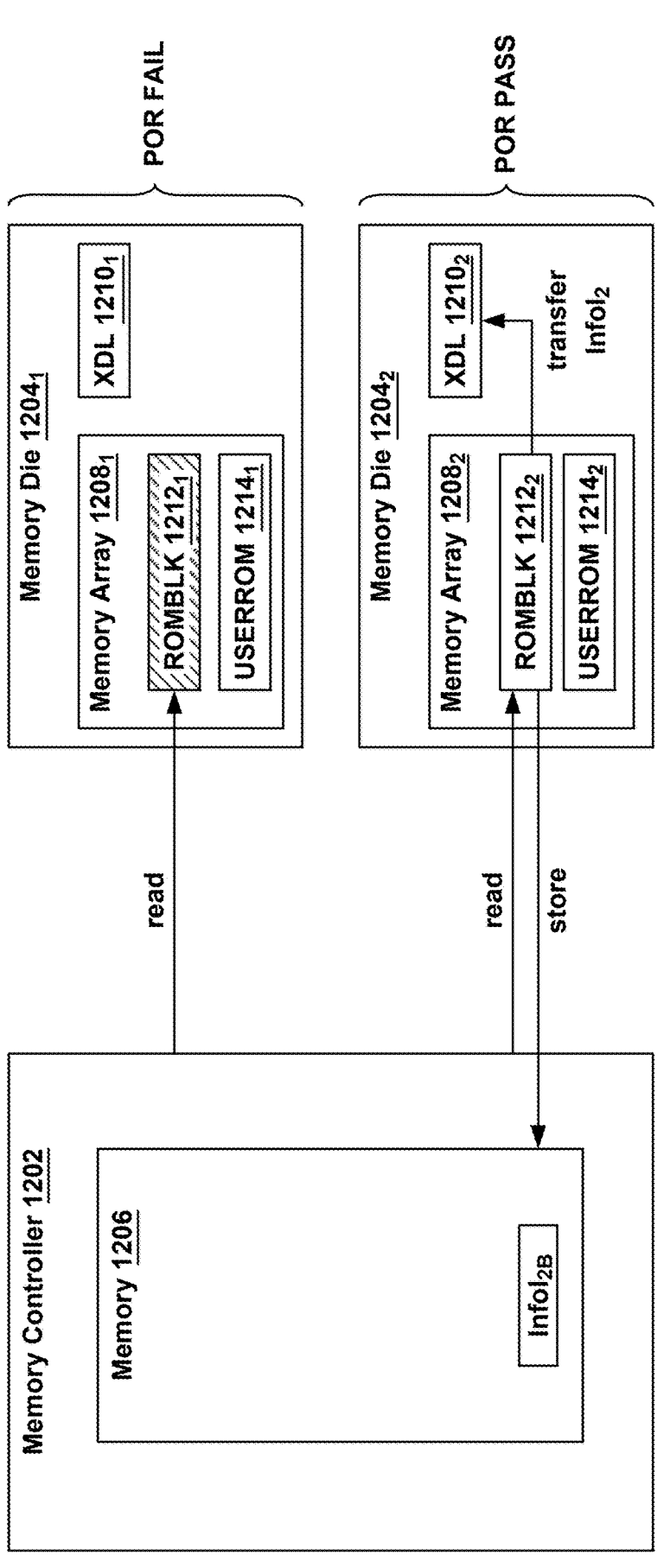
FIG. 12B depicts memory system of FIG. 12A during an in-field power on read sequence.

FIG. 12B depicts memory system 1200 of FIG. 12A during an in-field POR sequence. In the illustrated example, memory controller 1202 sends POR commands to each of first memory die $1204_1$ and second memory die $1204_2$.

In response to receiving the POR commands, first memory die $1204_1$ reads corresponding initialization information $InfoI_1$ from first ROMBLK $1212_1$ and second memory die $1204_2$ reads corresponding initialization information $InfoI_2$ from second ROMBLK $1212_2$.

In the illustrated example, corresponding initialization information $InfoI_2$ is successfully read from second ROM-BLK $1212_2$ and transferred to XDL $1210_2$, and the POR of second memory die $1204_2$ passes. In an embodiment, memory controller 1202 saves corresponding initialization information $InfoI_2$ as backup initialization information $InfoI_{2B}$ in memory 1206.

In the illustrated example the POR of first memory die $1204_1$ fails. The POR failure of first memory die $1204_1$ may be the a result of some failure of first ROMBLK $1212_1$.

Because corresponding initialization information $InfoI_1$ is not successfully read from second ROMBLK $1212_1$ memory controller 1202 does not save corresponding initialization information $InfoI_1$ in memory 1206.

Figure 12C:
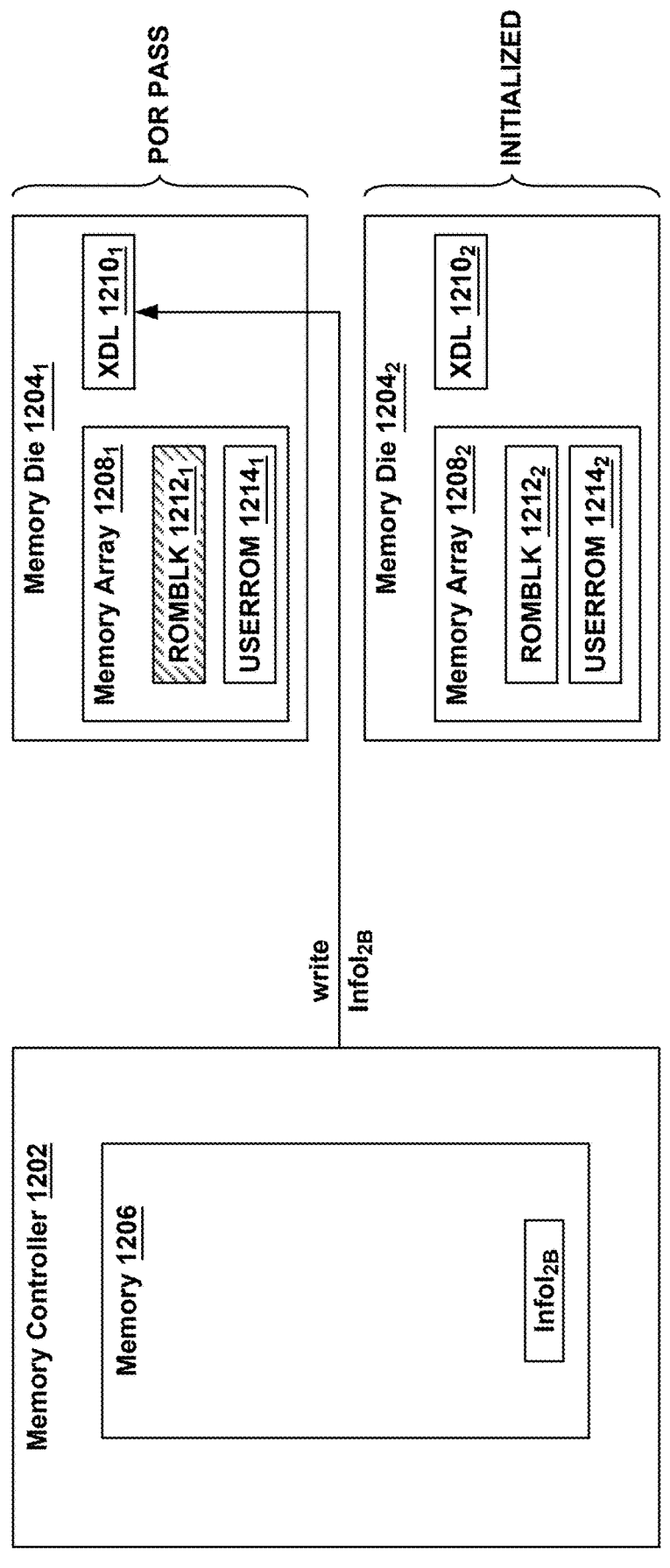
FIG. 12C is a simplified block diagram of the memory system of FIG. 12B while attempting to recover first memory die.

FIG. 12C is a simplified block diagram of the memory system of FIG. 12B while attempting to recover first memory die $1204_1$. In response to the POR failure of first memory die $1204_1$, memory controller 1202 loads some or all of backup initialization information $InfoI_{2B}$ into XDL $1210_1$ of first memory die $1204_1$. That is, memory controller 1202 attempts to initialize first memory die $1204_1$ using some or all of backup initialization information $InfoI_{2B}$ of second memory die $1204_2$. For example, memory controller 1202 may load some minimum set of parameters of backup initialization information $InfoI_{2B}$ into XDL $1210_1$ of first memory die $1204_1$.

In embodiments, steps 918-928 are then performed on first memory die $1204_1$ to determine if first memory die $1204_1$ successfully initialized, and if so to either retire first memory die $1204_1$ or program a new ROMBLK for first memory die $1204_1$ using a backup copy of initialization information $InfoI_{1B}$ that is stored in first USERROM $1214_1$.

Without wanting to be bound by any particular theory, it is believed that the example alternative process described above and facilitated by the memory system embodiments of FIGS. 12A-12C may be used to recover memory die from an in-field POR failure, and may reduce System DPPM.

Figure 13:
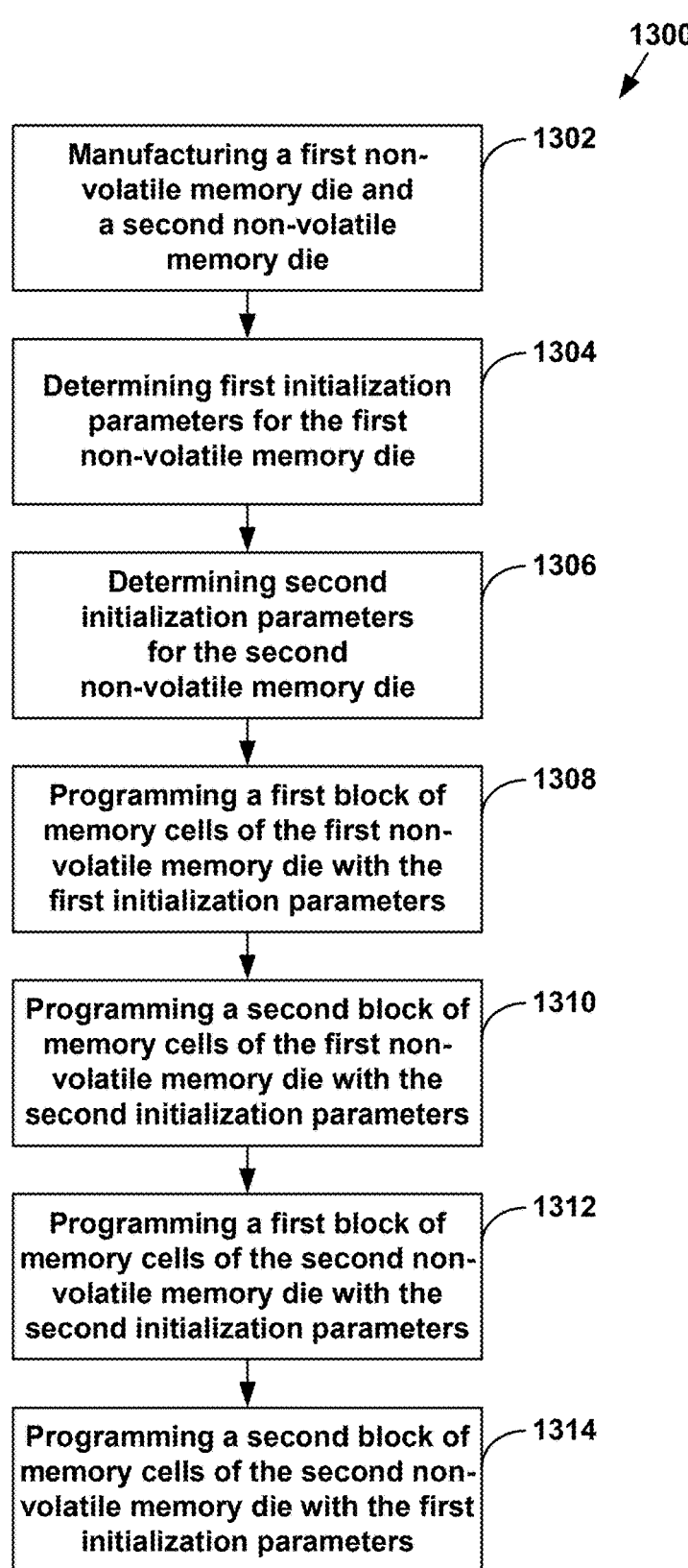
FIG. 13 is a flow diagram of an example process for determining and storing initialization information on a first non-volatile memory die and a second non-volatile memory die.

FIG. 13 is a flow diagram of an example process 1300 for determining and storing initialization information on a first non-volatile memory die and a second non-volatile memory die. In embodiments, process 1300 may be performed by a non-volatile memory die manufacturer or fabricator.

At step 1302, manufacturing a first non-volatile memory die and a second non-volatile memory die.

At step 1304, determining first initialization parameters for the first non-volatile memory die. In embodiments, the first initialization parameters are configured to initialize the first non-volatile memory die in response to a power on read command.

At step 1306, determining second initialization parameters for the second non-volatile memory die. In embodiments, the second initialization parameters are configured to initialize the second non-volatile memory die in response to the power on read command.

At step 1308, programming a first block of memory cells of the first non-volatile memory die with the first initialization parameters.

At step 1310, programming a second block of memory cells of the first non-volatile memory die with the second initialization parameters.

At step 1312, programming a first block of memory cells of the second non-volatile memory die with the second initialization parameters.

At step 1314, programming a second block of memory cells of the second non-volatile memory die with the first initialization parameters.

In an embodiment, an apparatus is provided that includes a first memory die including first corresponding initialization information and a first data latch, and a first control circuit coupled to the first memory die. The first control circuit is configured to send a power on read command to the first memory die, determine that the first memory die reported a power on read failure, retrieve a first backup copy of the first corresponding initialization information from a first storage location outside the first memory die, and load the retrieved first backup copy of the first corresponding initialization information to the first data latch.

In an embodiment, a memory system is provided that includes a first memory die including a first block of memory cells including first corresponding initialization information for the first memory die, and a second block of memory cells, and a second memory die including a third block of memory cells including second corresponding initialization information for the second memory die, and a fourth block of memory cells. The second block of memory cells includes a first backup copy of the second corresponding initialization information, and the fourth block of memory cells includes a first backup copy of the first corresponding initialization information.

In an embodiment, a method is provided that includes manufacturing a first non-volatile memory die and a second non-volatile memory die, determining first initialization parameters for the first non-volatile memory die, determining second initialization parameters for the second non-volatile memory die, programming a first block of memory cells of the first non-volatile memory die with the first initialization parameters, programming a second block of memory cells of the first non-volatile memory die with the second initialization parameters, programming a first block of memory cells of the second non-volatile memory die with the second initialization parameters, and programming a second block of memory cells of the second non-volatile memory die with the first initialization parameters. The first initialization parameters are configured to initialize the first non-volatile memory die in response to a power on read command, and the second initialization parameters are configured to initialize the second non-volatile memory die in response to the power on read command.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

The invention claimed is:

1. An apparatus comprising:
a first memory die comprising first corresponding initialization information and a first data latch; and
a first control circuit coupled to the first memory die, the first control circuit configured to:
    send a power on read command to the first memory die;
    determine that the first memory die reported a power on read failure;
    retrieve a first backup copy of the first corresponding initialization information from a first storage location outside the first memory die; and
    load the retrieved first backup copy of the first corresponding initialization information to the first data latch,
    wherien the first data latch is for initialization and backup.

2. The apparatus of claim 1, wherein:
the apparatus comprises a first memory system comprising the first memory die and a second memory die; and
the first storage location comprises the second memory die.

3. The apparatus of claim 1, wherein:
the apparatus comprises a first memory system comprising the first memory die and a second memory system comprising a second memory die; and
the first storage location comprises the second memory die.

4. The apparatus of claim 1, wherein:
the apparatus comprises a first memory system comprising the first memory die and the first control circuit; and
the first storage location comprises the first control circuit.

5. The apparatus of claim 1, wherein:
the apparatus comprises a first memory system comprising the first memory die and a second memory system comprising a second control circuit; and
the first storage location comprises the second control circuit.

6. The apparatus of claim 1, wherein the first control circuit is further configured to perform a test memory operation of the first memory die to determine if the first memory die correctly initialized.

7. The apparatus of claim 1, wherein the first control circuit is further configured to:
determine that the first memory die successfully initialized; and
relocate user data from the first memory die to a second memory die.

8. The apparatus of claim 1, wherein the first control circuit is further configured to:
determine that the first memory die successfully initialized; and
save new first corresponding initialization information on the first memory die.

9. The apparatus of claim 8, wherein the new first corresponding initialization information comprises the first backup copy of the first corresponding initialization information.

10. The apparatus of claim 8, wherein:
the first memory die comprises a block of memory cells configured to store test data and a second backup copy of the first initialization information;
the new first corresponding initialization information comprises the second backup copy of the first corresponding initialization information.

11. The apparatus of claim 1, wherein:

the apparatus comprises a memory system comprising the first memory die and the first control circuit; and the first control circuit is further configured to:

determine that the first memory die did not successfully initialize; and report a failure of the memory system.

12. The apparatus of claim 1, wherein the first data latch comprises an interface latch configured to store data from the first control circuit.

13. A memory system comprising:

a first memory die comprising a first block of memory cells comprising first corresponding initialization information for the first memory die, a first data latch, and a second block of memory cells; and a second memory die comprising a third block of memory cells comprising second corresponding initialization information for the second memory die, a second data latch and a fourth block of memory cells, wherein:

the second block of memory cells comprises a first backup copy of the second corresponding initialization information, wherien the first data latch is for initialization and backup, wherien the second data latch is for initialization and backup; and the fourth block of memory cells comprises a first backup copy of the first corresponding initialization information.

14. The memory system of claim 13, wherein:

the first block of memory cells is programmed with the first corresponding initialization information at the same time that the fourth block of memory cells is programmed with the first backup copy of the first corresponding initialization information; and the third block of memory cells is programmed with the second corresponding initialization information at the same time that the second block of memory cells is programmed with the first backup copy of the second corresponding initialization information.

15. The memory system of claim 14, wherein the first block of memory cells, the second block of memory cells, the third block of memory cells and the fourth block of memory cells are programmed during manufacture and testing of the first memory die and the second memory die.

16. The memory system of claim 14, wherein the first block of memory cells, the second block of memory cells, the third block of memory cells and the fourth block of memory cells are programmed prior to the first memory die and the second memory die being deployed for use by a user.

17. The memory system of claim 13, further comprising a memory controller coupled to the first memory die and the second memory die, the memory controller configured to:

send a power on read command to the first memory die;

determine that the first memory die reported a power on read failure;

retrieve the first backup copy of the first corresponding initialization information from the fourth block of memory cells; and load the retrieved first backup copy of the first corresponding initialization information to the first data latch on the first memory die.

18. The memory system of claim 17, wherein the memory controller is further configured to:

determine that the first memory die successfully initialized; and relocate user data from the first memory die to another memory die in the memory system.

19. The memory system of claim 17, wherein the memory controller is further configured to:

determine that the first memory die successfully initialized; and save new first corresponding initialization information on the first memory die.

20. A method comprising:

manufacturing a first non-volatile memory die and a second non-volatile memory die;

determining first initialization parameters for the first non-volatile memory die;

determining second initialization parameters for the second non-volatile memory die;

programming a first block of memory cells of the first non-volatile memory die with the first initialization parameters;

programming a second block of memory cells of the first non-volatile memory die with the second initialization parameters;

programming a first block of memory cells of the second non-volatile memory die with the second initialization parameters; and programming a second block of memory cells of the second non-volatile memory die with the first initialization parameters, wherein:

the first initialization parameters are configured to load the first non- volatile memory die into a first data latch in response to a power on read command; and the second initialization parameters are configured to load the second non- volatile memory die into a second data latch in response to the power on read command, wherien the first data latch is for initialization and backup, and wherien the second data latch is for initialization and backup.

\* \* \* \* \*